(12) United States Patent
Herman

(10) Patent No.: US 9,277,139 B2
(45) Date of Patent: Mar. 1, 2016

(54) GENERATING MODULATION PATTERNS FOR THE ACQUISITION OF MULTISCALE INFORMATION IN RECEIVED SIGNALS

(71) Applicant: InView Technology Corporation, Austin, TX (US)

(72) Inventor: Matthew A. Herman, Austin, TX (US)

(73) Assignee: InView Technology Corporation, Austin, TX (US)

(*) Notice: Subject to any disclaimer, the term of this patent is extended or adjusted under 35 U.S.C. 154(b) by 221 days.

(21) Appl. No.: 14/154,817

(22) Filed: Jan. 14, 2014

(65) Prior Publication Data

US 2014/0198236 A1 Jul. 17, 2014

Related U.S. Application Data

(60) Provisional application No. 61/753,359, filed on Jan. 16, 2013.

(51) Int. Cl.
  *H04N 5/228* (2006.01)
  *H04N 5/265* (2006.01)
  *H04N 5/335* (2011.01)

(52) U.S. Cl.
  CPC ............. *H04N 5/265* (2013.01); *H04N 5/335* (2013.01)

(58) Field of Classification Search
  USPC .............................................. 348/222.1, 241
  See application file for complete search history.

(56) References Cited

U.S. PATENT DOCUMENTS

| | | | | |
|---|---|---|---|---|
| 5,204,770 A * | 4/1993 | Kachru | ................... | G02F 2/02 359/26 |
| 5,546,128 A * | 8/1996 | Nakagakiuchi | ........ | G09G 3/002 348/207.99 |
| 8,199,244 B2 * | 6/2012 | Baraniuk | ................ | H04L 25/20 348/335 |
| 8,570,405 B2 * | 10/2013 | Kelly | ................. | G02B 26/0833 341/123 |
| 8,717,492 B2 * | 5/2014 | McMackin | ........ | G02B 26/0833 348/222.1 |
| 2005/0270528 A1 * | 12/2005 | Geshwind | ................ | G01J 3/02 356/330 |
| 2006/0038705 A1 * | 2/2006 | Brady | ...................... | G06T 9/00 341/123 |
| 2006/0239336 A1 * | 10/2006 | Baraniuk | ................ | H04L 25/20 375/216 |
| 2012/0038789 A1 * | 2/2012 | Kelly | ................. | G02B 26/0833 348/226.1 |
| 2012/0038790 A1 * | 2/2012 | Kelly | ................. | G02B 26/0833 348/226.1 |
| 2013/0128042 A1 * | 5/2013 | Bridge | .................. | H04N 5/232 348/143 |
| 2014/0063314 A1 * | 3/2014 | Sankaranarayanan | ............... | H04N 5/23293 348/333.02 |
| 2014/0168482 A1 * | 6/2014 | Herman | ................. | G06T 5/001 348/241 |

* cited by examiner

*Primary Examiner* — John Strege
(74) *Attorney, Agent, or Firm* — Meyertons Hood Kivlin Kowert & Goetzel, P.C.; Jeffrey C. Hood; Mark K. Brightwell

(57) ABSTRACT

A methodology for acquiring measurements of a signal at one or more scales of resolution, including: generating modulation patterns based on a predefined measurement matrix; modulating a received signal with the modulation patterns using the signal modulating array to obtain a modulated signal; and acquiring measurements of intensity of the modulated signal. Each modulation pattern is generated by: (a) selecting a corresponding row of the measurement matrix; (b) reordering elements of the selected row according to a permutation to obtain a reordered row; and (c) transferring the reordered row to the signal modulating array so that elements of the reordered row are mapped onto the signal modulating array. The permutation is defined so that a subset of the modulation patterns are coarse patterns that respect a partition of the signal modulating array into an array of superpixels, each superpixel including a respective group of the signal modulating elements.

20 Claims, 19 Drawing Sheets

|   | 0 | 1 | 2 | 3 | ... | ... | ... | c-2 | c-1 |
|---|---|---|---|---|-----|-----|-----|-----|-----|
| 0 | 0 | 1 | 2 | 3 | ... | ... | ... | c-2 | c-1 |
| 1 | c | c+1 | c+2 | c+3 | ... | ... | ... | 2c-2 | 2c-1 |
| 2 | 2c | 2c+1 | 2c+2 | 2c+3 | ... | ... | ... | 3c-2 | 3c-1 |
| 3 | 3c | 3c+1 | 3c+2 | 3c+3 | ... | ... | ... | 4c-2 | 4c-1 |
| ... | ... | ... | ... | ... | | | | ... | ... |
| ... | ... | ... | ... | ... | | | | | |
| ... | ... | ... | ... | ... | | | | ... | ... |
| r-2 | (r-2)c | (r-2)c+1 | (r-2)c+2 | (r-2)c+3 | ... | ... | ... | (r-1)c-2 | (r-1)c-1 |
| r-1 | (r-1)c | (r-1)c+1 | (r-1)c+2 | (r-1)c+3 | ... | ... | ... | rc-2 | rc-1 |

*FIG. 6*

|   | 0 | 1 | 2 | ... | R-2 | R-1 |
|---|---|---|---|-----|-----|-----|
| 0 | 0 | 1 | 2 | ... | R-2 | R-1 |
| 1 | C | C+1 | C+2 | ... | (R-2)C+1 | (R-1)C+1 |
| 2 | 2C | 2C+1 | 2C+2 | ... | (R-2)C+1 | (R-1)C+1 |
| ... | ... | ... | ... |  | ... | ... |
| C-2 | C-2 | 2C-2 | 3C-2 | ... | (R-1)C-2 | RC-2 |
| C-1 | C-1 | 2C-1 | 3C-1 | ... | (R-1)C-1 | RC-1 |

| | 000 | 001 | 010 | 011 | 100 | 101 | 110 | 111 |
|---|---|---|---|---|---|---|---|---|
| 1111 | 27 | 59 | 91 | 123 | 31 | 63 | 95 | 127 |
| 1110 | 19 | 51 | 83 | 115 | 23 | 55 | 87 | 119 |
| 1101 | 11 | 43 | 75 | 107 | 15 | 47 | 79 | 111 |
| 1100 | 3 | 35 | 67 | 99 | 7 | 39 | 71 | 103 |
| 1011 | 26 | 58 | 90 | 122 | 30 | 62 | 94 | 126 |
| 1010 | 18 | 50 | 82 | 114 | 22 | 54 | 86 | 118 |
| 1001 | 10 | 42 | 74 | 106 | 14 | 46 | 78 | 110 |
| 1000 | 2 | 34 | 66 | 98 | 6 | 38 | 70 | 102 |
| 0111 | 25 | 57 | 89 | 121 | 29 | 61 | 93 | 125 |
| 0110 | 17 | 49 | 81 | 113 | 21 | 53 | 85 | 117 |
| 0101 | 9 | 41 | 73 | 105 | 13 | 45 | 77 | 109 |
| 0100 | 1 | 33 | 65 | 97 | 5 | 37 | 69 | 101 |
| 0011 | 24 | 56 | 88 | 120 | 28 | 60 | 92 | 124 |
| 0010 | 16 | 48 | 80 | 112 | 20 | 52 | 84 | 116 |
| 0001 | 8 | 40 | 72 | 104 | 12 | 44 | 76 | 108 |
| 0000 | 0 | 32 | 64 | 96 | 4 | 36 | 68 | 100 |

FIG. 9

GENERATING MODULATION PATTERNS FOR THE ACQUISITION OF MULTISCALE INFORMATION IN RECEIVED SIGNALS

PRIORITY CLAIM DATA

This application claims the benefit of priority to U.S. Provisional Application No. 61/753,359, filed on Jan. 16, 2013, entitled "Sensing with Multiscale Hadamard Waveforms", invented by Matthew A. Herman, which is hereby incorporated by reference in its entirety as though fully and completely set forth herein.

FIELD OF THE INVENTION

The present invention relates to the field of compressive sensing, and more particularly, to a mechanism for generating modulation patterns in a manner that supports the acquisition of multiscale information in signals received by a compressive imaging device.

DESCRIPTION OF THE RELATED ART

According to Nyquist theory, a signal x(t) whose signal energy is supported on the frequency interval [−B,B] may be reconstructed from samples {x(nT)} of the signal x(t), provided the rate $f_S = 1/T_S$ at which the samples are captured is sufficiently high, i.e., provided that $f_S$ is greater than 2B. Similarly, for a signal whose signal energy is supported on the frequency interval [A,B], the signal may be reconstructed from samples captured with sample rate greater than B−A. A fundamental problem with any attempt to capture a signal x(t) according to Nyquist theory is the large number of samples that are generated, especially when B (or B−A) is large. The large number of samples is taxing on memory resources and on the capacity of transmission channels.

Nyquist theory is not limited to functions of time. Indeed, Nyquist theory applies more generally to any function of one or more real variables. For example, Nyquist theory applies to functions of two spatial variables such as images, to functions of time and two spatial variables such as video, and to the functions used in multispectral imaging, hyperspectral imaging, medical imaging and a wide variety of other applications. In the case of an image I(x,y) that depends on spatial variables x and y, the image may be reconstructed from samples of the image, provided the samples are captured with sufficiently high spatial density. For example, given samples {I(nΔx, mΔy)} captured along a rectangular grid, the horizontal and vertical densities 1/Δx and 1/Δy should be respectively greater than $2B_x$ and $2B_y$, where $B_x$ and $B_y$ are the highest x and y spatial frequencies occurring in the image I(x,y). The same problem of overwhelming data volume is experienced when attempting to capture an image according to Nyquist theory. The modern theory of compressive sensing is directed to such problems.

Compressive sensing relies on the observation that many signals (e.g., images or video sequences) of practical interest are not only band-limited but also sparse or approximately sparse when represented using an appropriate choice of transformation, for example, a transformation such as a Fourier transform, a wavelet transform or a discrete cosine transform (DCT). A signal vector v is said to be K-sparse with respect to a given transformation G when the transformation of the signal vector, Gv, has no more than K non-zero coefficients. A signal vector v is said to be sparse with respect to a given transformation G when it is K-sparse with respect to that transformation for some integer K much smaller than the number L of components in the transformation vector Gv.

A signal vector v is said to be approximately K-sparse with respect to a given transformation G when the coefficients of the transformation vector, Gv, are dominated by the K largest coefficients (i.e., largest in the sense of magnitude or absolute value). In other words, if the K largest coefficients account for a high percentage of the energy in the entire set of coefficients, then the signal vector v is approximately K-sparse with respect to transformation G. A signal vector v is said to be approximately sparse with respect to a given transformation G when it is approximately K-sparse with respect to the transformation G for some integer K much less than the number L of components in the transformation vector Gv.

Given a sensing device that captures images with N samples per image and in conformity to the Nyquist condition on spatial rates, it is often the case that there exists some transformation and some integer K very much smaller than N such that the transform of each captured image will be approximately K sparse. The set of K dominant coefficients may vary from one image to the next. Furthermore, the value of K and the selection of the transformation may vary from one context (e.g., imaging application) to the next. Examples of typical transforms that might work in different contexts include the Fourier transform, the wavelet transform, the DCT, the Gabor transform, etc.

Compressive sensing specifies a way of operating on the N samples of an image so as to generate a much smaller set of samples from which the N samples may be reconstructed, given knowledge of the transform under which the image is sparse (or approximately sparse). In particular, compressive sensing invites one to think of the N samples as a vector v in an N-dimensional space and to imagine projecting the vector v onto each vector in a series of M vectors {R(i): i=1, 2, ..., M} in the N-dimensional space, where M is larger than K but still much smaller than N. Each projection gives a corresponding real number S(i), e.g., according to the expression $$S(i) = \langle v, R(i) \rangle,$$

where the notation <v,R(i)> represents the inner product (or dot product) of the vector v and the vector R(i). Thus, the series of M projections gives a vector U including M real numbers: $U_i = S(i)$. Compressive sensing theory further prescribes methods for reconstructing (or estimating) the vector v of N samples from the vector U of M real numbers and the series of measurement vectors {R(i): i=1, 2, ..., M}. For example, according to one method, one should determine the vector x that has the smallest length (in the sense of the $L_1$ norm) subject to the condition that ΦTx=U, where Φ is a matrix whose rows are the transposes of the vectors R(i), where T is a transformation under which the image is K sparse or approximately K sparse.

Compressive sensing is important because, among other reasons, it allows reconstruction of an image based on M measurements instead of the much larger number of measurements N recommended by Nyquist theory. Thus, for example, a compressive sensing camera would be able to capture a significantly larger number of images for a given size of image store, and/or, transmit a significantly larger number of images per unit time through a communication channel of given capacity.

As mentioned above, compressive sensing operates by projecting the image vector v onto a series of M vectors. As discussed in U.S. Pat. No. 8,199,244, issued Jun. 12, 2012 (invented by Baraniuk et al.) and illustrated in FIG. 1, an imaging device (e.g., camera) may be configured to take advantage of the compressive-sensing paradigm by using a digital micromirror device (DMD) 40. An incident lightfield 10 passes through a lens 20 and then interacts with the DMD 40. The DMD includes a two-dimensional array of micromirrors, each of which is configured to independently and controllably switch between two orientation states. Each micromirror reflects a corresponding portion of the incident light field based on its instantaneous orientation. Any micromirrors in a first of the two orientation states will reflect their corresponding light portions so that they pass through lens 50. Any micromirrors in a second of the two orientation states will reflect their corresponding light portions away from lens 50. Lens 50 serves to concentrate the light portions from micromirrors in the first orientation state onto a photodiode (or photodetector) situated at location 60. Thus, the photodiode generates a signal whose amplitude at any given time represents a sum of the intensities of the light portions from the micromirrors in the first orientation state.

The compressive sensing is implemented by driving the orientations of the micromirrors through a series of spatial patterns. Each spatial pattern specifies an orientation state for each of the micromirrors. Each of the spatial patterns may be derived from a corresponding row of the matrix $\Phi$, e.g., by wrapping the corresponding row into a 2D array whose dimensions match the dimensions of the micromirror array. The output signal of the photodiode is digitized by an A/D converter 70. In this fashion, the imaging device is able to capture a series of measurements {S(k)} that represent inner products (dot products) between the incident light field and the series of spatial patterns without first acquiring the incident light field as a pixelized digital image. The incident light field corresponds to the vector v of the discussion above, and the spatial patterns correspond to the vectors R(i) of the discussion above.

The incident light field may be modeled by a function I(x,y,t) of two spatial variables and time. Assuming for the sake of discussion that the DMD comprises a rectangular array, the DMD implements a spatial modulation of the incident light field so that the light field leaving the DMD in the direction of the lens 50 might be modeled by $$\{I(n\Delta x, m\Delta y, t) * M(n,m,t)\}$$

where m and n are integer indices, where $I(n\Delta x, m\Delta y, t)$ represents the portion of the light field that is incident upon that $(n,m)^{th}$ mirror of the DMD at time t. The function $M(n,m,t)$ represents the orientation of the $(n,m)^{th}$ mirror of the DMD at time t. At sampling times, the function $M(n,m,t)$ equals one or zero, depending on the state of the digital control signal that controls the $(n,m)^{th}$ mirror. The condition $M(n,m,t)=1$ corresponds to the orientation state that reflects onto the path that leads to the lens 50. The condition $M(n,m,t)=0$ corresponds to the orientation state that reflects away from the lens 50.

The lens 50 concentrates the spatially-modulated light field $$\{I(n\Delta x, m\Delta y, t) * M(n,m,t)\}$$

onto a light sensitive surface of the photodiode. Thus, the lens and the photodiode together implement a spatial summation of the light portions in the spatially-modulated light field:

$$S(t) = \sum_{n,m} I(n\Delta x, m\Delta y, t) M(n, m, t).$$

Signal S(t) may be interpreted as the intensity at time t of the concentrated spot of light impinging upon the light sensing surface of the photodiode. The A/D converter captures measurements of S(t). In this fashion, the compressive sensing camera optically computes an inner product of the incident light field with each spatial pattern imposed on the mirrors. The multiplication portion of the inner product is implemented by the mirrors of the DMD. The summation portion of the inner product is implemented by the concentrating action of the lens and also the integrating action of the photodiode.

In the context of compressive sensing, it is generally desirable for the spatial patterns applied by the DMD to be incoherent with respect to the sparsity basis (i.e., the basis in which the image is sparse). One basic way to achieve incoherence is to generate rows of a structured matrix $M_{ST}$ (such as a Hadamard transform or discrete Fourier transform) and then apply a randomizing permutation $P_{Rand}$ of fine resolution to each of the generated rows. Thus, the spatial patterns are effectively drawn from rows of the product matrix $M_{ST}P_{Rand}$. However, after such randomization, it may be difficult to find any particular subset of rows that will effectively capture coarse-scale information in the received image (i.e., the image carried in the incident light field). It may be useful to capture such coarse-scale information, e.g., to support the estimation and display of a coarse image to the user prior to estimation and display of a finer-scale image. Thus, there is a need for mechanisms capable of generating measurement patterns that are incoherent and that have a clearly identified subset designed for the acquisition of coarse-scale information in the received image (or signal). It would be further desirable if such mechanisms could clearly identify additional subsets designed for the capture of successively finer scales of information in the received image (or signal).

SUMMARY

In one set of embodiments, a method for acquiring measurements of an image at one or more scales of resolution may include the following operations.

The method may involve generating a temporal sequence of modulation patterns for an array of light modulating elements (e.g., an array of micromirrors). The temporal sequence of modulation patterns is based on a predefined measurement matrix. Each of the modulation patterns is generated by performing a set of operations including: (a) selecting a corresponding row of the measurement matrix; (b) reordering elements of the selected row according to a permutation to obtain a reordered row; and (c) transferring the reordered row to the array of light modulating elements so that elements of the reordered row are mapped onto the array of light modulating elements. The permutation is defined so that a first subset of the modulation patterns are coarse patterns that respect a partition of the array of light modulating elements into an array of superpixels. The permutation may be a permutation on contiguous bit groups within a column index of the selected row. Each of the superpixels includes a respective group of two or more of the light modulating elements.

The method may also involve modulating a light stream with the temporal sequence of modulation patterns to obtain a modulated light stream. The action of modulating the light stream is performed by the array of light modulating elements.

The method may also include acquiring measurements of intensity of the modulated light stream, where each of the measurements corresponds to a respective one of the modulation patterns.

In some embodiments, the method may also include operating (e.g., performing a transform, or executing a CS image reconstruction algorithm) on a first subset of the measurements corresponding to the first subset of the modulation patterns to obtain a coarse image at a resolution corresponding to the superpixels. (CS is an acronym for compressive sensing.)

In some embodiments, the measurement matrix includes a plurality of row blocks, where the first subset of the modulation patterns are generated from a first of the row blocks.

In some embodiments, the method may also include operating (e.g., performing a transform, or executing a CS image reconstruction algorithm) on a second subset of the measurements corresponding to a second subset of the modulation patterns to obtain a finer-scale image at a resolution finer than the superpixels, where the second subset of modulation patterns includes the first subset of modulation patterns and additional modulation patterns. The additional modulation patterns are based on one or more additional ones of the row blocks.

In some embodiments, the method may also include operating on a second subset of the measurements corresponding to a second subset of the modulation patterns to obtain a finer-scale image at a resolution finer than the superpixels, where the second subset of modulation patterns includes the first subset of modulation patterns and additional modulation patterns, where the additional modulation patterns are based on a partial sampling of rows in one or more additional ones of the row blocks.

In some embodiments, the method may also include operating on a second subset of the measurements corresponding to a second subset of the modulation patterns to obtain a finer-scale image at a resolution finer than the superpixels, where the second subset of modulation patterns are based on one or more of the row blocks other than the first row block.

In some embodiments, the method may also include operating on a second subset of the measurements corresponding to a second subset of the modulation patterns to detect an event, or classify an object, or identify an object occurring in an external environment, where the second subset of modulation patterns are based on one or more of the row blocks other than the first row block.

In some embodiments, the measurement matrix is of the form $H_F \otimes H_B$, where $H_F$ is a Hadamard matrix of order F, where $H_B$ is a Hadamard matrix of order B, where $\otimes$ denotes the Kronecker product operator.

In some embodiments, the set of operations used to generated each modulation pattern also includes: prior to said transferring the reordered row, modifying the reordered row by multiplying the reordered row with a vector of 1s and −1s in an element-wise fashion, where the 1s and −1s are positioned within the vector in order to define a pseudo-random modulation pattern at the resolution of the superpixels.

In some embodiments, the set of operations used to generate each modulation pattern also includes: prior to said transferring the reordered row, modifying the reordered row by multiplying the reordered row with a vector of 1s and −1s in an element-wise fashion, where the 1s and −1s are positioned within the vector in order to define a pseudo-random modulation pattern at a resolution finer than the superpixels.

In some embodiments, the set of operations used to generate each modulation pattern also includes: prior to said transferring the reordered row, applying a second reordering to the reordered row, where the second reordering permutes the values of indices within each superpixel.

A methodology for acquiring measurements of a signal at one or more scales of resolution, including: generating modulation patterns based on a predefined measurement matrix; modulating a received signal with the modulation patterns using the signal modulating array to obtain a modulated signal; and acquiring measurements of intensity of the modulated signal. Each modulation pattern is generated by: (a) selecting a corresponding row of the measurement matrix; (b) reordering elements of the selected row according to a permutation to obtain a reordered row; and (c) transferring the reordered row to the signal modulating array so that elements of the reordered row are mapped onto the signal modulating array. The permutation is defined so that a subset of the modulation patterns are coarse patterns that respect a partition of the signal modulating array into an array of superpixels, each superpixel including a respective group of the signal modulating elements.

Additional embodiments are described in U.S. Provisional Application No. 61/753,359, filed on Jan. 16, 2013, entitled "Sensing with Multiscale Hadamard Waveforms".

BRIEF DESCRIPTION OF THE DRAWINGS

A better understanding of the present invention can be obtained when the following detailed description of the preferred embodiments is considered in conjunction with the following drawings.

FIG. 6 illustrates the positions of "pixels" (i.e., light modulating elements) in an array of light modulating elements having r rows and c columns, according to a row majorized ordering of the pixels.

FIG. 7 illustrates the positions of "superpixels" (i.e., groups of light modulating elements) in a superpixel array having R rows and C columns, according to a row majorized ordering of the superpixels.

FIG. 8 illustrates an ordering of pixel positions on an array of light modulating elements having 8 rows and 16 columns.

FIG. 9 illustrates a permuted ordering pixel positions corresponding to the array of FIG. 8.

FIGS. 15A-C show the results of the presently-disclosed method for M/N=0.25, 0.0625 and 0.0156, respectively. FIGS. 15D-F show the results of the typical compressive sensing approach for M/N=0.25, 0.0625 and 0.0156, respectively.

Figure 1:
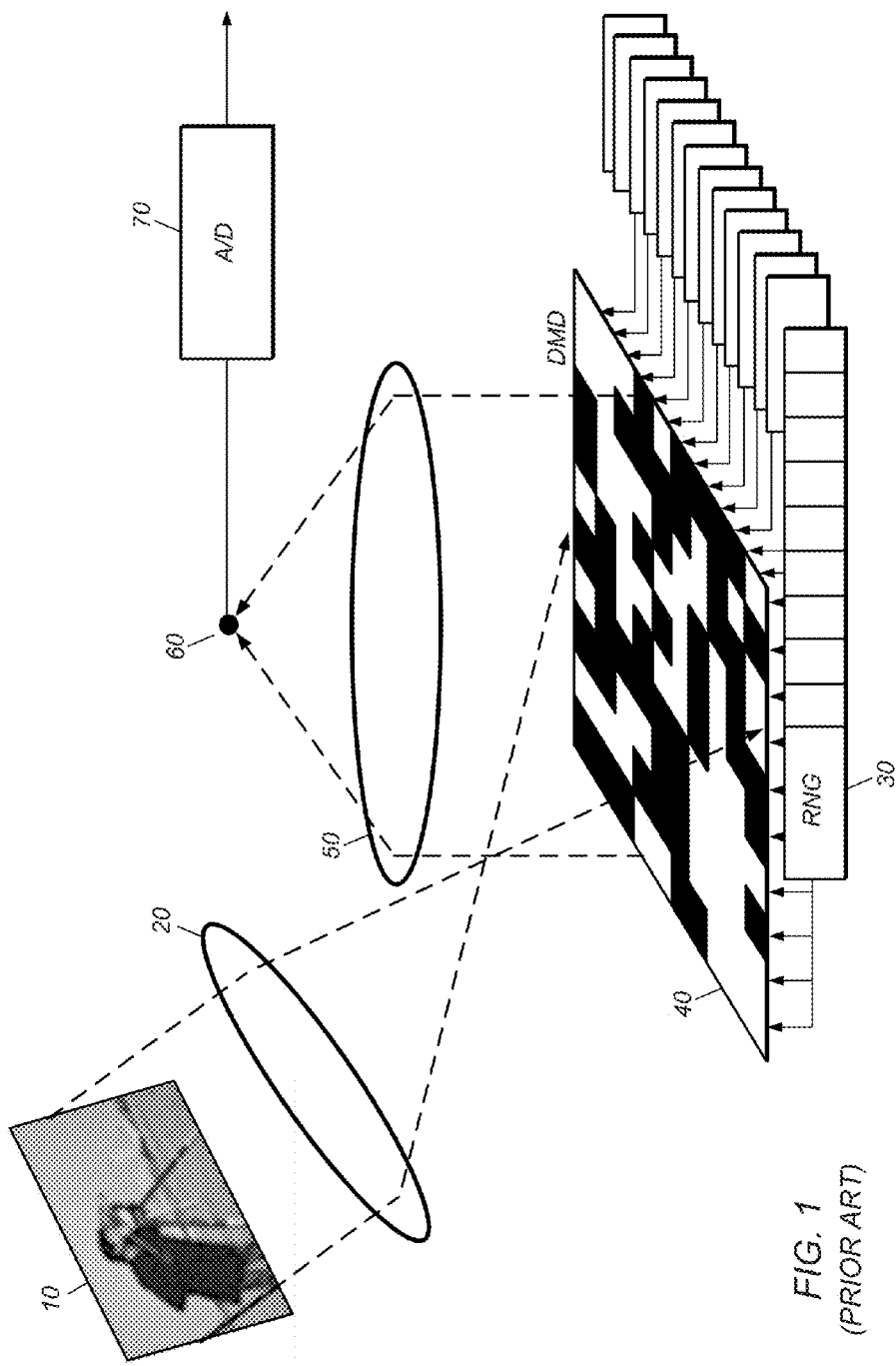
FIG. 1 illustrates a compressive sensing camera according to the prior art.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Incorporations by Reference

The following documents are hereby incorporated by reference in their entireties as though fully and completely set forth herein.

U.S. patent application Ser. No. 13/207,900, filed Aug. 11, 2011, entitled "TIR Prism to Separate Incident Light and Modulated Light in Compressive Imaging Device", invented by McMackin and Chatterjee;

U.S. patent application Ser. No. 13/197,304, filed Aug. 3, 2011, entitled "Decreasing Image Acquisition Time for Compressive Imaging Devices", invented by Kelly, Baraniuk, McMackin, Bridge, Chatterjee and Weston;

U.S. patent application Ser. No. 14/106,542, filed Dec. 13, 2013, entitled "Overlap Patterns and Image Stitching for Multiple-Detector Compressive-Sensing Camera", invented by Herman, Hewitt, Weston and McMackin.

TERMINOLOGY

A memory medium is a non-transitory medium configured for the storage and retrieval of information. Examples of memory media include: various kinds of semiconductor-based memory such as RAM and ROM; various kinds of magnetic media such as magnetic disk, tape, strip and film; various kinds of optical media such as CD-ROM and DVD-ROM; various media based on the storage of electrical charge and/or any of a wide variety of other physical quantities; media fabricated using various lithographic techniques; etc. The term "memory medium" includes within its scope of meaning the possibility that a given memory medium might be a union of two or more memory media that reside at different locations, e.g., in different portions of an integrated circuit or on different integrated circuits in an electronic system or on different computers in a computer network.

A computer-readable memory medium may be configured so that it stores program instructions and/or data, where the program instructions, if executed by a computer system, cause the computer system to perform a method, e.g., any of a method embodiments described herein, or, any combination of the method embodiments described herein, or, any subset of any of the method embodiments described herein, or, any combination of such subsets.

A computer system is any device (or combination of devices) having at least one processor that is configured to execute program instructions stored on a memory medium. Examples of computer systems include personal computers (PCs), workstations, laptop computers, tablet computers, mainframe computers, server computers, client computers, network or Internet appliances, hand-held devices, mobile devices, personal digital assistants (PDAs), tablet computers, computer-based television systems, grid computing systems, wearable computers, computers implanted in living organisms, computers embedded in head-mounted displays, computers embedded in sensors forming a distributed network, computers embedded in a camera devices or imaging devices or spectral measurement devices, etc.

A programmable hardware element (PHE) is a hardware device that includes multiple programmable function blocks connected via a system of programmable interconnects. Examples of PHEs include FPGAs (Field Programmable Gate Arrays), PLDs (Programmable Logic Devices), FPOAs (Field Programmable Object Arrays), and CPLDs (Complex PLDs). The programmable function blocks may range from fine grained (combinatorial logic or look up tables) to coarse grained (arithmetic logic units or processor cores).

As used herein, the term "light" is meant to encompass within its scope of meaning any electromagnetic radiation whose spectrum lies within the wavelength range $[\lambda_L, \lambda_U]$, where the wavelength range includes the visible spectrum, the ultra-violet (UV) spectrum, infrared (IR) spectrum and the terahertz (THz) spectrum. Thus, for example, visible radiation, or UV radiation, or IR radiation, or THz radiation, or any combination thereof is "light" as used herein.

In some embodiments, a computer system may be configured to include a processor (or a set of processors) and a memory medium, where the memory medium stores program instructions, where the processor is configured to read and execute the program instructions stored in the memory medium, where the program instructions are executable by the processor to implement a method, e.g., any of the various method embodiments described herein, or, any combination of the method embodiments described herein, or, any subset of any of the method embodiments described herein, or, any combination of such subsets.

System 100 for Operating on Light

Figure 2A:
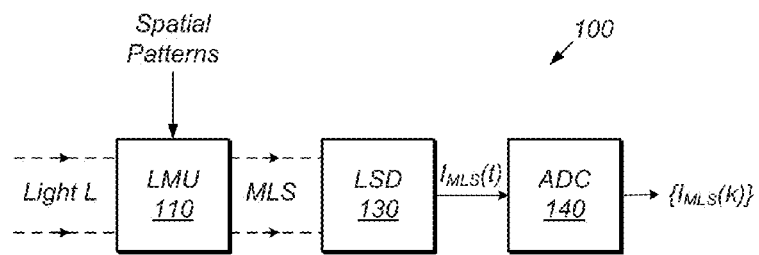
FIG. 2A illustrates one embodiment of a system 100 that is operable to capture compressive imaging samples and also samples of background light level. (LMU is an acronym for "light modulation unit". MLS is an acronym for "modulated light stream". LSD is an acronym for "light sensing device".)

A system 100 for operating on light may be configured as shown in FIG. 2A. The system 100 may include a light modulation unit 110, a light sensing device 130 and an analog-to-digital converter (ADC) 140.

The light modulation unit 110 is configured to modulate a received stream of light L with a series of spatial patterns in order to produce a modulated light stream (MLS). The spatial patterns of the series may be applied sequentially to the light stream so that successive time slices of the light stream are modulated, respectively, with successive ones of the spatial patterns. (The action of sequentially modulating the light stream L with the spatial patterns imposes the structure of time slices on the light stream.) The light modulation unit 110 includes a plurality of light modulating elements configured to modulate corresponding portions of the light stream. Each of the spatial patterns specifies an amount (or extent or value) of modulation for each of the light modulating elements. Mathematically, one might think of the light modulation unit's action of applying a given spatial pattern as performing an element-wise multiplication of a light field vector $(x_{ij})$ representing a time slice of the light stream L by a vector of scalar modulation values $(m_{ij})$, to obtain a time slice of the modulated light stream: $(m_{ij})*(x_{ij})=(m_{ij}*x_{ij})$. The vector $(m_{ij})$ is specified by the spatial pattern. Each light modulating element effectively scales (multiplies) the intensity of its corresponding light stream portion by the corresponding scalar factor.

The light modulation unit 110 may be realized in various ways. In some embodiments, the LMU 110 may be realized by a plurality of mirrors (e.g., micromirrors) whose orientations are independently controllable. In another set of embodiments, the LMU 110 may be realized by an array of elements whose transmittances are independently controllable, e.g., as with an array of LCD shutters. An electrical control signal supplied to each element controls the extent to which light is able to transmit through the element. In yet another set of embodiments, the LMU 110 may be realized by an array of independently-controllable mechanical shutters (e.g., micromechanical shutters) that cover an array of apertures, with the shutters opening and closing in response to electrical control signals, thereby controlling the flow of light through the corresponding apertures. In yet another set of embodiments, the LMU 110 may be realized by a perforated mechanical plate, with the entire plate moving in response to electrical control signals, thereby controlling the flow of light through the corresponding perforations. In yet another set of embodiments, the LMU 110 may be realized by an array of transceiver elements, where each element receives and then immediately retransmits light in a controllable fashion. In yet another set of embodiments, the LMU 110 may be realized by a grating light valve (GLV) device. In yet another embodiment, the LMU 110 may be realized by a liquid-crystal-on-silicon (LCOS) device.

In some embodiments, the light modulating elements are arranged in an array, e.g., a two-dimensional array or a one-dimensional array. Any of various array geometries are contemplated. For example, in some embodiments, the array is a square array or rectangular array. In another embodiment, the array is hexagonal. In some embodiments, the light modulating elements are arranged in a spatially random fashion.

Let N denote the number of light modulating elements in the light modulation unit 110. In various embodiments, the number N may take a wide variety of values. For example, in different sets of embodiments, N may be, respectively, in the range [64, 256], in the range [256, 1024], in the range [1024, 4096], in the range $[2^{12}, 2^{14}]$, in the range $[2^{14}, 2^{16}]$, in the range $[2^{16}, 2^{18}]$, in the range $[2^{18}, 2^{20}]$, in the range $[2^{20}, 2^{22}]$, in the range $[2^{22}, 2^{24}]$, in the range $[2^{24}, 2^{26}]$, in the range from $2^{26}$ to infinity. The particular value used in any given embodiment may depend on one or more factors specific to the embodiment.

The light sensing device 130 may be configured to receive the modulated light stream MLS and to generate an analog electrical signal $I_{MLS}(t)$ representing intensity of the modulated light stream as a function of time.

The light sensing device 130 may include one or more light sensing elements. The term "light sensing element" may be interpreted as meaning "a transducer between a light signal and an electrical signal". For example, a photodiode is a light sensing element. In various other embodiments, light sensing elements might include devices such as metal-semiconductor-metal (MSM) photodetectors, phototransistors, phototubes and photomultiplier tubes.

In some embodiments, the light sensing device 130 includes one or more amplifiers (e.g., transimpedance amplifiers) to amplify the analog electrical signals generated by the one or more light sensing elements.

The ADC 140 acquires a sequence of samples $\{I_{MLS}(k)\}$ of the analog electrical signal $I_{MLS}(t)$. Each of the samples may be interpreted as an inner product between a corresponding time slice of the light stream L and a corresponding one of the spatial patterns. The set of samples $\{I_{MLS}(k)\}$ comprises an encoded representation, e.g., a compressed representation, of an image (or a video sequence) and may be used to reconstruct the image (or video sequence) based on any reconstruction algorithm known in the field of compressive sensing. (For video sequence reconstruction, the samples may be partitioned into contiguous subsets, and then the subsets may be processed to reconstruct corresponding images.)

In some embodiments, the samples $\{I_{MLS}(k)\}$ may be used for some purpose other than, or in addition to, image (or video) reconstruction. For example, system 100 (or some other system) may operate on the samples to perform an inference task, such as detecting the presence of a signal or object, identifying a signal or an object, classifying a signal or an object, estimating one or more parameters relating to a signal or an object, tracking a signal or an object, etc. In some embodiments, an object under observation by system 100 may be identified or classified by virtue of its sample set $\{I_{MLS}(k)\}$ (or parameters derived from that sample set) being similar to one of a collection of stored sample sets (or parameter sets).

In some embodiments, the light sensing device 130 includes exactly one light sensing element. (For example, the single light sensing element may be a photodiode.) The light sensing element may couple to an amplifier (e.g., a TIA) (e.g., a multi-stage amplifier).

In some embodiments, the light sensing device 130 may include a plurality of light sensing elements (e.g., photodiodes). Each light sensing element may convert light impinging on its light sensing surface into a corresponding analog electrical signal representing intensity of the impinging light as a function of time. In some embodiments, each light sensing element may couple to a corresponding amplifier so that the analog electrical signal produced by the light sensing element can be amplified prior to digitization. System 100 may be configured so that each light sensing element receives, e.g., a corresponding spatial portion (or spectral portion) of the modulated light stream.

In one embodiment, the analog electrical signals produced, respectively, by the light sensing elements may be summed to obtain a sum signal. The sum signal may then be digitized by the ADC 140 to obtain the sequence of samples $\{I_{MLS}(k)\}$. In another embodiment, the analog electrical signals may be individually digitized, each with its own ADC, to obtain corresponding sample sequences. The sample sequences may then be added to obtain the sequence $\{I_{MLS}(k)\}$. In another embodiment, the analog electrical signals produced by the light sensing elements may be sampled by a smaller number of ADCs than light sensing elements through the use of time multiplexing. For example, in one embodiment, system 100 may be configured to sample two or more of the analog electrical signals by switching the input of an ADC among the outputs of the two or more corresponding light sensing elements at a sufficiently high rate.

In some embodiments, the light sensing device 130 may include an array of light sensing elements. Arrays of any of a wide variety of sizes, configurations and material technologies are contemplated. In one embodiment, the light sensing device 130 includes a focal plane array coupled to a readout integrated circuit. In one embodiment, the light sensing device 130 may include an array of cells, where each cell includes a corresponding light sensing element and is configured to integrate and hold photo-induced charge created by the light sensing element, and to convert the integrated charge into a corresponding cell voltage. The light sensing device may also include (or couple to) circuitry configured to sample the cell voltages using one or more ADCs.

In some embodiments, the light sensing device 130 may include a plurality (or array) of light sensing elements, where each light sensing element is configured to receive a corresponding spatial portion of the modulated light stream, and each spatial portion of the modulated light stream comes from a corresponding sub-region of the array of light modulating elements. (For example, the light sensing device 130 may include a quadrant photodiode, where each quadrant of the photodiode is configured to receive modulated light from a corresponding quadrant of the array of light modulating elements. As another example, the light sensing device 130 may include a bi-cell photodiode. As yet another example, the light sensing device 130 may include a focal plane array.) Each light sensing element generates a corresponding signal representing intensity of the corresponding spatial portion as a function of time. Each signal may be digitized (e.g., by a corresponding ADC, or perhaps by a shared ADC) to obtain a corresponding sequence of samples. Thus, a plurality of sample sequences are obtained, one sample sequence per light sensing element. Each sample sequence may be processed to reconstruct a corresponding sub-image (or sub-video sequence). The sub-images may be joined together to form a whole image (or whole video sequence). The sample sequences may be captured in response to the modulation of the incident light stream with a sequence of M spatial patterns, e.g., as variously described above. By employing any of various reconstruction algorithms known in the field of compressive sensing, the number of pixels (voxels) in each reconstructed image (sub-video sequence) may be greater than (e.g., much greater than) M. To reconstruct each sub-image (sub-video), the reconstruction algorithm uses the corresponding sample sequence and the restriction of the spatial patterns to the corresponding sub-region of the array of light modulating elements.

In some embodiments, the light sensing device 130 includes a small number of light sensing elements (e.g., in respective embodiments, one, two, less than 8, less than 16, less the 32, less than 64, less than 128, less than 256). Because the light sensing device of these embodiments includes a small number of light sensing elements (e.g., far less than the typical modern CCD-based or CMOS-based camera), an entity interested in producing any of these embodiments may afford to spend more per light sensing element to realize features that are beyond the capabilities of modern array-based image sensors of large pixel count, e.g., features such as higher sensitivity, extended range of sensitivity, new range(s) of sensitivity, extended dynamic range, higher bandwidth/lower response time. Furthermore, because the light sensing device includes a small number of light sensing elements, an entity interested in producing any of these embodiments may use newer light sensing technologies (e.g., based on new materials or combinations of materials) that are not yet mature enough to be manufactured into focal plane arrays (FPA) with large pixel count. For example, new detector materials such as super-lattices, quantum dots, carbon nanotubes and graphene can significantly enhance the performance of IR detectors by reducing detector noise, increasing sensitivity, and/or decreasing detector cooling requirements.

In one embodiment, the light sensing device 130 is a thermo-electrically cooled InGaAs detector. (InGaAs stands for "Indium Gallium Arsenide".) In other embodiments, the InGaAs detector may be cooled by other mechanisms (e.g., liquid nitrogen or a Sterling engine). In yet other embodiments, the InGaAs detector may operate without cooling. In yet other embodiments, different detector materials may be used, e.g., materials such as MCT (mercury-cadmium-telluride), InSb (Indium Antimonide) and VOx (Vanadium Oxide).

In different embodiments, the light sensing device 130 may be sensitive to light at different wavelengths or wavelength ranges. In some embodiments, the light sensing device 130 may be sensitive to light over a broad range of wavelengths, e.g., over the entire visible spectrum or over the entire range $[\lambda_L, \lambda_U]$ as defined above.

In some embodiments, the light sensing device 130 may include one or more dual-sandwich photodetectors. A dual sandwich photodetector includes two photodiodes stacked (or layered) one on top of the other.

In one embodiment, the light sensing device 130 may include one or more avalanche photodiodes.

In one embodiment, the light sensing device 130 may include one or more photomultiplier tubes (PMTs).

In some embodiments, a filter may be placed in front of the light sensing device 130 to restrict the modulated light stream to a specific range of wavelengths or specific polarization. Thus, the signal $I_{MLS}(t)$ generated by the light sensing device 130 may be representative of the intensity of the restricted light stream. For example, by using a filter that passes only IR light, the light sensing device may be effectively converted into an IR detector. The sample principle may be applied to effectively convert the light sensing device into a detector for red or blue or green or UV or any desired wavelength band, or, a detector for light of a certain polarization.

In some embodiments, system 100 includes a color wheel whose rotation is synchronized with the application of the spatial patterns to the light modulation unit. As it rotates, the color wheel cyclically applies a number of optical bandpass filters to the modulated light stream MLS. Each bandpass filter restricts the modulated light stream to a corresponding sub-band of wavelengths. Thus, the samples captured by the ADC 140 will include samples of intensity in each of the sub-bands. The samples may be de-multiplexed to form separate sub-band sequences. Each sub-band sequence may be processed to generate a corresponding sub-band image. (As an example, the color wheel may include a red-pass filter, a green-pass filter and a blue-pass filter to support color imaging.)

In some embodiments, the system 100 may include a memory (or a set of memories of one or more kinds).

Figure 2B:
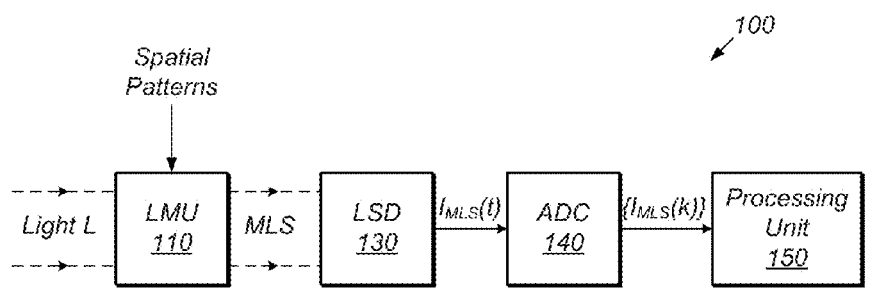
FIG. 2B illustrates an embodiment of system 100 that includes a processing unit 150.

In some embodiments, system 100 may include a processing unit 150, e.g., as shown in FIG. 2B. The processing unit 150 may be a digital circuit or a combination of digital circuits. For example, the processing unit may be a microprocessor (or system of interconnected of microprocessors), a programmable hardware element such as a field-programmable gate array (FPGA), an application specific integrated circuit (ASIC), or any combination such elements. The processing unit 150 may be configured to perform one or more functions such as image/video reconstruction, system control, user interface, statistical analysis, and one or more inferences tasks.

The system 100 (e.g., the processing unit 150) may store the samples $\{I_{MLS}(k)\}$ in a memory, e.g., a memory resident in the system 100 or in some other system.

In one embodiment, processing unit 150 is configured to operate on the samples $\{I_{MLS}(k)\}$ to generate the image or video sequence. In this embodiment, the processing unit 150 may include a microprocessor configured to execute software (i.e., program instructions), especially software for performing an image/video reconstruction algorithm. In one embodiment, system 100 is configured to transmit the compensated samples to some other system through a communication channel. (In embodiments where the spatial patterns are randomly-generated, system 100 may also transmit the random seed(s) used to generate the spatial patterns.) That other system may operate on the samples to reconstruct the image/video. System 100 may have one or more interfaces configured for sending (and perhaps also receiving) data through one or more communication channels, e.g., channels such as wireless channels, wired channels, fiber optic channels, acoustic channels, laser-based channels, etc.

In some embodiments, processing unit 150 is configured to use any of a variety of algorithms and/or any of a variety of transformations to perform image/video reconstruction. System 100 may allow a user to choose a desired algorithm and/or a desired transformation for performing the image/video reconstruction.

In some embodiments, the system 100 is configured to acquire a set $Z_M$ of samples from the ADC 140 so that the sample set $Z_M$ corresponds to M of the spatial patterns applied to the light modulation unit 110, where M is a positive integer. The number M is selected so that the sample set $Z_M$ is useable to reconstruct an n-pixel image or n-voxel video sequence that represents the incident light stream, where n is a positive integer less than or equal to the number N of light modulating elements in the light modulation unit 110. System 100 may be configured so that the number M is smaller than n. Thus, system 100 may operate as a compressive sensing device. (The number of "voxels" in a video sequence is the number of images in the video sequence times the number of pixels per image, or equivalently, the sum of the pixel counts of the images in the video sequence.)

In various embodiments, the compression ratio M/n may take any of a wide variety of values. For example, in different sets of embodiments, M/n may be, respectively, in the range [0.9,0.8], in the range [0.8,0.7], in the range [0.7,0.6], in the range [0.6,0.5], in the range [0.5,0.4], in the range [0.4,0.3], in the range [0.3,0.2], in the range [0.2,0.1], in the range [0.1, 0.05], in the range [0.05,0.01], in the range [0.001,0.01].

Superpixels for Modulation at Lower Spatial Resolution

As noted above, the image reconstructed from the sample subset $Z_M$ may be an n-pixel image with n≤N. The spatial patterns may be designed to support a value of n less than N, e.g., by forcing the array of light modulating elements to operate at a lower effective resolution than the physical resolution N. For example, the spatial patterns may be designed to force each 2×2 cell of light modulating elements to act in unison. At any given time, the modulation state of the four elements in a 2×2 cell will agree. Thus, the effective resolution of the array of light modulating elements is reduced to N/4. This principle generalizes to any cell size, to cells of any shape, and to collections of cells with non-uniform cell size and/or cell shape. For example, a collection of cells of size $k_H \times k_V$, where $k_H$ and $k_V$ are positive integers, would give an effective resolution equal to $N/(k_H k_V)$. In one alternative embodiment, cells near the center of the array may have smaller sizes than cells near the periphery of the array.

The "cells" of the above discussion are referred to herein as "superpixels". When the reconstruction algorithm generates an image (video frame) from the acquired sample data, each superpixel corresponds to one or more pixels in the reconstructed image (video frame).

Restricting the Spatial Patterns to a Subset of the Modulation Array

Another way the spatial patterns may be arranged to support the reconstruction of an n-pixel image with n less than N is to allow the spatial patterns to vary only within a subset (or region) of the array of light modulating elements. In this mode of operation, the spatial patterns are null (take the value zero) outside the subset. (Control unit 120 may be configured to implement this restriction of the spatial patterns.) Light modulating elements corresponding to positions outside of the subset do not send any light (or send only the minimum amount of light attainable) to the light sensing device. Thus, the reconstructed image is restricted to the subset. In some embodiments, each spatial pattern (e.g., of a measurement pattern sequence) may be multiplied element-wise by a binary mask that takes the one value only in the allowed subset, and the resulting product pattern may be supplied to the light modulation unit. In some embodiments, the subset is a contiguous region of the array of light modulating elements, e.g., a rectangle or a circular disk or a hexagon. In some embodiments, the size and/or position of the region may vary (e.g., dynamically). The position of the region may vary in order to track a moving object. The size of the region may vary in order to dynamically control the rate of image acquisition or video frame rate. In some embodiments, the size of the region may be determined by user input. For example, system 100 may provide an input interface (GUI and/or mechanical control device) through which the user may vary the size of the region over a continuous range of values (or alternatively, a discrete set of values), thereby implementing a digital zoom function. Furthermore, in some embodiments, the position of the region within the field of view may be controlled by user input.

Oversampling Relative to Pattern Modulation Rate

In some embodiments, the A/D converter 140 may oversample the electrical signal generated by the light sensing device 130, i.e., acquire samples of the electrical signal at a rate higher than (e.g., a multiple of) the pattern modulation rate. The pattern modulation rate is the rate at which the spatial patterns are applied to the incident light stream L by the light modulation unit 110. Thus, the A/D converter may generate a plurality of samples per spatial pattern. The plurality of samples may be averaged to obtain a single averaged sample per spatial pattern. The averaging tends to reduce noise, and thus, to increase quality of image reconstruction. The averaging may be performed by processing unit 150 or some other processing agent. The oversampling ratio may be controlled by setting the pattern modulation rate and/or setting the A/D sampling rate.

In one embodiment, system 100 may include a light transmitter configured to generate a light beam (e.g., a laser beam), to modulate the light beam with a data signal and to transmit the modulated light beam into space or onto an optical fiber. System 100 may also include a light receiver configured to receive a modulated light beam from space or from an optical fiber, and to recover a data stream from the received modulated light beam.

In one embodiment, system 100 may be configured as a low-cost sensor system having minimal processing resources, e.g., processing resources insufficient to perform image (or video) reconstruction in user-acceptable time. In this embodiment, the system 100 may store and/or transmit the samples $\{I_{MLS}(k)\}$ so that another agent, more plentifully endowed with processing resources, may perform the image/video reconstruction based on the samples.

Figure 2C:
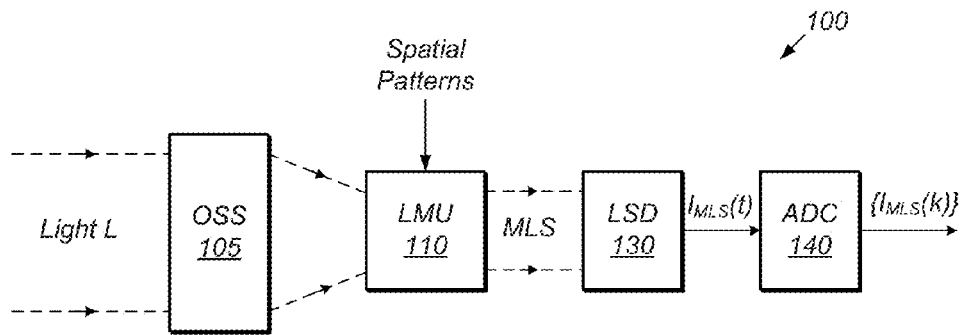
FIG. 2C illustrates an embodiment of system 100 that includes an optical subsystem 105 to focus received light L onto the light modulation unit 110.
Figure 2D:
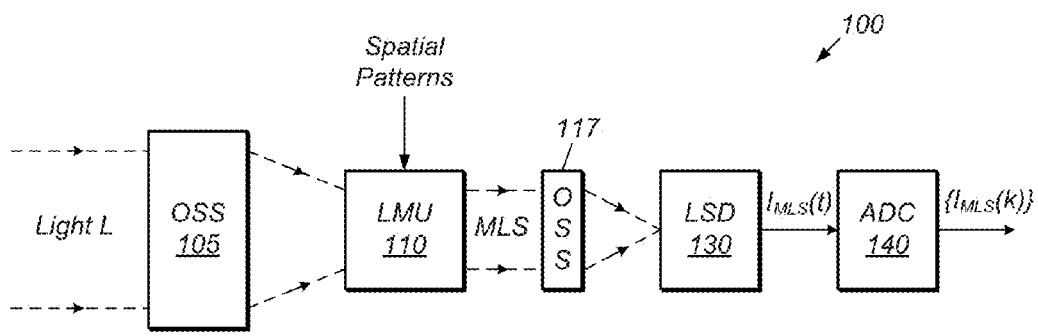
FIG. 2D illustrates an embodiment of system 100 that includes an optical subsystem 117 to direct or focus or concentrate the modulated light stream MLS onto the light sensing device 130.

In some embodiments, system 100 may include an optical subsystem 105 that is configured to modify or condition the light stream L before it arrives at the light modulation unit 110, e.g., as shown in FIG. 2C. For example, the optical subsystem 105 may be configured to receive the light stream L from the environment and to focus the light stream onto a modulating plane of the light modulation unit 110. The optical subsystem 105 may include a camera lens (or a set of lenses). The lens (or set of lenses) may be adjustable to accommodate a range of distances to external objects being imaged/sensed/captured. The optical subsystem 105 may allow manual and/or digital control of one or more parameters such as focus, zoom, shutter speed and f-stop.

In some embodiments, system 100 may include an optical subsystem 117 to direct the modulated light stream MLS onto a light sensing surface (or surfaces) of the light sensing device 130.

In some embodiments, the optical subsystem 117 may include one or more lenses, and/or, one or more mirrors.

In some embodiments, the optical subsystem 117 is configured to focus the modulated light stream onto the light sensing surface (or surfaces). The term "focus" implies an attempt to achieve the condition that rays (photons) diverging from a point on an object plane converge to a point (or an acceptably small spot) on an image plane. The term "focus" also typically implies continuity between the object plane point and the image plane point (or image plane spot); points close together on the object plane map respectively to points (or spots) close together on the image plane. In at least some of the system embodiments that include an array of light sensing elements, it may be desirable for the modulated light stream MLS to be focused onto the light sensing array so that there is continuity between points on the light modulation unit LMU and points (or spots) on the light sensing array.

In some embodiments, the optical subsystem 117 may be configured to direct the modulated light stream MLS onto the light sensing surface (or surfaces) of the light sensing device 130 in a non-focusing fashion. For example, in a system embodiment that includes only one photodiode, it may not be so important to achieve the "in focus" condition at the light sensing surface of the photodiode since positional information of photons arriving at that light sensing surface will be immediately lost.

In one embodiment, the optical subsystem 117 may be configured to receive the modulated light stream and to concentrate the modulated light stream into an area (e.g., a small area) on a light sensing surface of the light sensing device 130. Thus, the diameter of the modulated light stream may be reduced (possibly, radically reduced) in its transit from the optical subsystem 117 to the light sensing surface (or surfaces) of the light sensing device 130. For example, in some embodiments, the diameter may be reduced by a factor of more than 1.5 to 1. In other embodiments, the diameter may be reduced by a factor of more than 2 to 1. In yet other embodiments, the diameter may be reduced by a factor of more than 10 to 1. In yet other embodiments, the diameter may be reduced by factor of more than 100 to 1. In yet other embodiments, the diameter may be reduced by factor of more than 400 to 1. In one embodiment, the diameter is reduced so that the modulated light stream is concentrated onto the light sensing surface of a single light sensing element (e.g., a single photodiode).

In some embodiments, this feature of concentrating the modulated light stream onto the light sensing surface (or surfaces) of the light sensing device allows the light sensing device to sense at any given time the sum (or surface integral) of the intensities of the modulated light portions within the modulated light stream. (Each time slice of the modulated light stream comprises a spatial ensemble of modulated light portions due to the modulation unit's action of applying the corresponding spatial pattern to the light stream.)

In some embodiments, the modulated light stream MLS may be directed onto the light sensing surface of the light sensing device 130 without concentration, i.e., without decrease in diameter of the modulated light stream, e.g., by use of photodiode having a large light sensing surface, large enough to contain the cross section of the modulated light stream without the modulated light stream being concentrated.

Figure 2E:
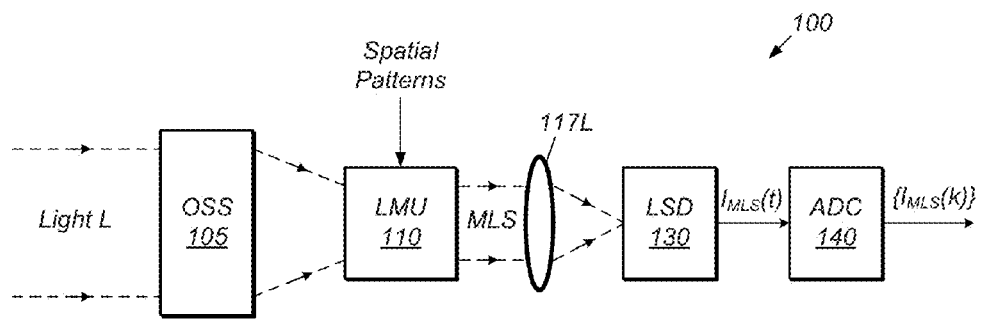
FIG. 2E illustrates an embodiment where the optical subsystem 117 is realized by a lens 117L.

In some embodiments, the optical subsystem 117 may include one or more lenses. FIG. 2E shows an embodiment where optical subsystem 117 is realized by a lens 117L, e.g., a biconvex lens or a condenser lens.

In some embodiments, the optical subsystem 117 may include one or more mirrors. In one embodiment, the optical subsystem 117 includes a parabolic mirror (or spherical mirror) to concentrate the modulated light stream onto a neighborhood (e.g., a small neighborhood) of the parabolic focal point. In this embodiment, the light sensing surface of the light sensing device may be positioned at the focal point.

In some embodiments, system 100 may include an optical mechanism (e.g., an optical mechanism including one or more prisms and/or one or more diffraction gratings) for splitting or separating the modulated light stream MLS into two or more separate streams (perhaps numerous streams), where each of the streams is confined to a different wavelength range. The separate streams may each be sensed by a separate light sensing device. (In some embodiments, the number of wavelength ranges may be, e.g., greater than 8, or greater than 16, or greater than 64, or greater than 256, or greater than 1024.) Furthermore, each separate stream may be directed (e.g., focused or concentrated) onto the corresponding light sensing device as described above in connection with optical subsystem 117. The samples captured from each light sensing device may be used to reconstruct a corresponding image (or video sequence) for the corresponding wavelength range. In one embodiment, the modulated light stream is separated into red, green and blue streams to support color (R,G,B) measurements. In another embodiment, the modulated light stream may be separated into IR, red, green, blue and UV streams to support five-channel multi-spectral imaging: (IR, R, G, B, UV). In some embodiments, the modulated light stream may be separated into a number of sub-bands (e.g., adjacent sub-bands) within the IR band to support multi-spectral or hyper-spectral IR imaging. In some embodiments, the number of IR sub-bands may be, e.g., greater than 8, or greater than 16, or greater than 64, or greater than 256, or greater than 1024. In some embodiments, the modulated light stream may experience two or more stages of spectral separation. For example, in a first stage the modulated light stream may be separated into an IR stream confined to the IR band and one or more additional streams confined to other bands. In a second stage, the IR stream may be separated into a number of sub-bands (e.g., numerous sub-bands) (e.g., adjacent sub-bands) within the IR band to support multispectral or hyper-spectral IR imaging.

In some embodiments, system 100 may include an optical mechanism (e.g., a mechanism including one or more beam splitters) for splitting or separating the modulated light stream MLS into two or more separate streams, e.g., where each of the streams have the same (or approximately the same) spectral characteristics or wavelength range. The separate streams may then pass through respective bandpass filters to obtain corresponding modified streams, where each modified stream is restricted to a corresponding band of wavelengths. Each of the modified streams may be sensed by a separate light sensing device. (In some embodiments, the number of wavelength bands may be, e.g., greater than 8, or greater than 16, or greater than 64, or greater than 256, or greater than 1024.) Furthermore, each of the modified streams may be directed (e.g., focused or concentrated) onto the corresponding light sensing device as described above in connection with optical subsystem 117. The samples captured from each light sensing device may be used to reconstruct a corresponding image (or video sequence) for the corresponding wavelength band. In one embodiment, the modulated light stream is separated into three streams which are then filtered, respectively, with a red-pass filter, a green-pass filter and a blue-pass filter. The resulting red, green and blue streams are then respectively detected by three light sensing devices to support color (R,G,B) acquisition. In another similar embodiment, five streams are generated, filtered with five respective filters, and then measured with five respective light sensing devices to support (IR, R, G, B, UV) multi-spectral acquisition. In yet another embodiment, the modulated light stream of a given band may be separated into a number of (e.g., numerous) sub-bands to support multi-spectral or hyper-spectral imaging.

In some embodiments, system 100 may include an optical mechanism for splitting or separating the modulated light stream MLS into two or more separate streams. The separate streams may be directed to (e.g., concentrated onto) respective light sensing devices. The light sensing devices may be configured to be sensitive in different wavelength ranges, e.g., by virtue of their different material properties. Samples captured from each light sensing device may be used to reconstruct a corresponding image (or video sequence) for the corresponding wavelength range.

Figure 2F:
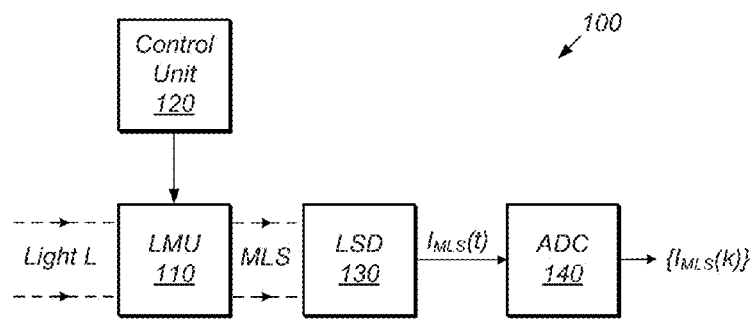
FIG. 2F illustrates an embodiment of system 100 that includes a control unit that is configured to supply a series of spatial patterns to the light modulation unit 110.

In some embodiments, system 100 may include a control unit 120 configured to supply the spatial patterns to the light modulation unit 110, as shown in FIG. 2F. The control unit may itself generate the patterns or may receive the patterns from some other agent. The control unit 120 and the ADC 140 may be controlled by a common clock signal so that ADC 140 can coordinate (synchronize) its action of capturing the samples $\{I_{MLS}(k)\}$ with the control unit's action of supplying spatial patterns to the light modulation unit 110. (System 100 may include clock generation circuitry.)

In some embodiments, the control unit 120 may supply the spatial patterns to the light modulation unit in a periodic fashion.

The control unit 120 may be a digital circuit or a combination of digital circuits. For example, the control unit may include a microprocessor (or system of interconnected of microprocessors), a programmable hardware element such as a field-programmable gate array (FPGA), an application specific integrated circuit (ASIC), or any combination such elements.

In some embodiments, the control unit 120 may include a random number generator (RNG) or a set of random number generators to generate the spatial patterns or some subset of the spatial patterns.

In some embodiments, system 100 is battery powered. In some embodiments, the system 100 includes a set of one or more solar cells and associated circuitry to derive power from sunlight.

In some embodiments, system 100 includes its own light source for illuminating the environment or a target portion of the environment.

In some embodiments, system 100 may include a display (or an interface configured for coupling to a display) for displaying reconstructed images/videos.

In some embodiments, system 100 may include one or more input devices (and/or, one or more interfaces for input devices), e.g., any combination or subset of the following devices: a set of buttons and/or knobs, a keyboard, a keypad, a mouse, a touch-sensitive pad such as a trackpad, a touch-sensitive display screen, one or more microphones, one or more temperature sensors, one or more chemical sensors, one or more pressure sensors, one or more accelerometers, one or more orientation sensors (e.g., a three-axis gyroscopic sensor), one or more proximity sensors, one or more antennas, etc.

Regarding the spatial patterns that are used to modulate the light stream L, it should be understood that there are a wide variety of possibilities. In some embodiments, the control unit 120 may be programmable so that any desired set of spatial patterns may be used.

In some embodiments, the spatial patterns are binary valued. Such an embodiment may be used, e.g., when the light modulating elements are two-state devices. In some embodiments, the spatial patterns are n-state valued, where each element of each pattern takes one of n states, where n is an integer greater than two. (Such an embodiment may be used, e.g., when the light modulating elements are each able to achieve n or more modulation states). In some embodiments, the spatial patterns are real valued, e.g., when each of the light modulating elements admits a continuous range of modulation. (It is noted that even a two-state modulating element may be made to effectively apply a continuous range of modulation by duty cycling the two states during modulation intervals.)

Coherence

The spatial patterns may belong to a set of measurement vectors that is incoherent with a set of vectors in which the image/video is approximately sparse ("the sparsity vector set"). (See "Sparse Signal Detection from Incoherent Projections", Proc. Int. Conf. Acoustics, Speech Signal Processing—ICASSP, May 2006, Duarte et al.) Given two sets of vectors $A=\{a_i\}$ and $B=\{b_i\}$ in the same N-dimensional space, A and B are said to be incoherent if their coherence measure $\mu(A,B)$ is sufficiently small. Assuming that the vectors $\{a_i\}$ and $\{b_i\}$ each have unit $L^2$ norm, then coherence measure may be defined as:

$$\mu(A, B) = \max_{i,j} |\langle a_i, b_j \rangle|.$$

The number of compressive sensing measurements (i.e., samples of the sequence $\{I_{MLS}(k)\}$ needed to reconstruct an N-pixel image (or N-voxel video sequence) that accurately represents the scene being captured is a strictly increasing function of the coherence between the measurement vector set and the sparsity vector set. Thus, better compression can be achieved with smaller values of the coherence.

In some embodiments, the measurement vector set may be based on a code. Any of various codes from information theory may be used, e.g., codes such as exponentiated Kerdock codes, exponentiated Delsarte-Goethals codes, run-length limited codes, LDPC codes, Reed Solomon codes and Reed Muller codes.

In some embodiments, the measurement vector set corresponds to a randomized or permuted basis, where the basis may be, for example, the DCT basis (DCT is an acronym for Discrete Cosine Transform) or Hadamard basis.

In some embodiments, the spatial patterns may be random or pseudo-random patterns, e.g., generated according to a random number generation (RNG) algorithm using one or more seeds. In some embodiments, the elements of each pattern are generated by a series of Bernoulli trials, where each trial has a probability p of giving the value one and probability 1-p of giving the value zero. (For example, in one embodiment p=1/2.) In some embodiments, the elements of each pattern are generated by a series of draws from a Gaussian random variable.)

The system 100 may be configured to operate in a compressive fashion, where the number of the samples $\{I_{MLS}(k)\}$ captured by the system 100 is less than (e.g., much less than) the number of pixels in the image (or video) to be reconstructed from the samples. In many applications, this compressive realization is very desirable because it saves on power consumption, memory utilization and transmission bandwidth consumption. However, non-compressive realizations are contemplated as well.

In some embodiments, the system 100 is configured as a camera or imager that captures information representing an image (or a series of images) from the external environment, e.g., an image (or a series of images) of some external object or scene. The camera system may take different forms in different application domains, e.g., domains such as visible light photography, infrared photography, ultraviolet photography, high-speed photography, low-light photography, underwater photography, multi-spectral imaging, hyper-spectral imaging, etc. In some embodiments, system 100 is configured to operate in conjunction with (or as part of) another system, e.g., in conjunction with (or as part of) a microscope, a telescope, a robot, a security system, a surveillance system, a fire sensor, a node in a distributed sensor network, etc.

In some embodiments, system 100 is configured as a spectrometer.

In some embodiments, system 100 is configured as a multi-spectral or hyper-spectral imager.

In some embodiments, system 100 may configured as a single integrated package, e.g., as a camera.

In some embodiments, system 100 may also be configured to operate as a projector. Thus, system 100 may include a light source, e.g., a light source located at or near a focal point of optical subsystem 117. In projection mode, the light modulation unit 110 may be supplied with an image (or a sequence of images), e.g., by control unit 120. The light modulation unit may receive a light beam generated by the light source, and modulate the light beam with the image (or sequence of images) to obtain a modulated light beam. The modulated light beam exits the system 100 and is displayed on a display surface (e.g., an external screen).

In one embodiment, the light modulation unit 110 may receive the light beam from the light source and modulate the light beam with a time sequence of spatial patterns (from a measurement pattern set). The resulting modulated light beam exits the system 100 and is used to illuminate the external scene. Light reflected from the external scene in response to the modulated light beam is measured by a light sensing device (e.g., a photodiode). The samples captured by the light sensing device comprise compressive measurements of external scene. Those compressive measurements may be used to reconstruct an image or video sequence as variously described above.

In some embodiments, system 100 includes an interface for communicating with a host computer. The host computer may send control information and/or program code to the system 100 via the interface. Furthermore, the host computer may receive status information and/or compressive sensing measurements from system 100 via the interface.

Figure 3A:
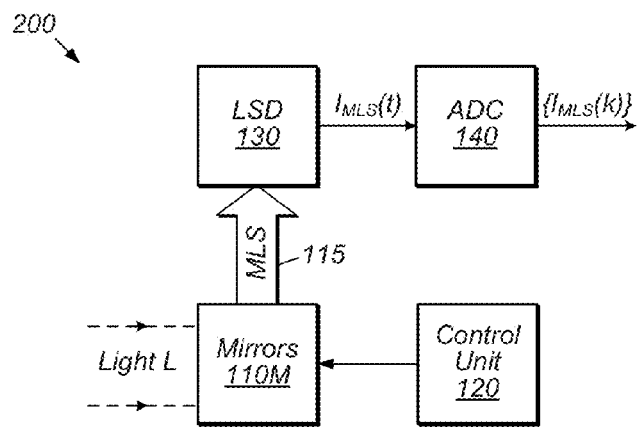
FIG. 3A illustrates system 200, where the light modulation unit 110 is realized by a plurality of mirrors (collectively referenced by label 110M).

In one realization 200 of system 100, the light modulation unit 110 may be realized by a plurality of mirrors, e.g., as shown in FIG. 3A. (The mirrors are collectively indicated by the label 110M.) The mirrors 110M are configured to receive corresponding portions of the light L received from the environment, albeit not necessarily directly from the environment. (There may be one or more optical elements, e.g., one or more lenses along the input path to the mirrors 110M.) Each of the mirrors is configured to controllably switch between at least two orientation states. In addition, each of the mirrors is configured to (a) reflect the corresponding portion of the light onto a sensing path 115 when the mirror is in a first of the two orientation states and (b) reflect the corresponding portion of the light away from the sensing path when the mirror is in a second of the two orientation states.

In some embodiments, the mirrors 110M are arranged in an array, e.g., a two-dimensional array or a one-dimensional array. Any of various array geometries are contemplated. For example, in different embodiments, the array may be a square array, a rectangular array, a hexagonal array, etc. In some embodiments, the mirrors are arranged in a spatially-random fashion.

The mirrors 110M may be part of a digital micromirror device (DMD). For example, in some embodiments, one of the DMDs manufactured by Texas Instruments may be used.

The control unit 120 may be configured to drive the orientation states of the mirrors through the series of spatial patterns, where each of the patterns of the series specifies an orientation state for each of the mirrors.

The light sensing device 130 may be configured to receive the light portions reflected at any given time onto the sensing path 115 by the subset of mirrors in the first orientation state and to generate an analog electrical signal $I_{MLS}(t)$ representing a cumulative intensity of the received light portions as function of time. As the mirrors are driven through the series of spatial patterns, the subset of mirrors in the first orientation state will vary from one spatial pattern to the next. Thus, the cumulative intensity of light portions reflected onto the sensing path 115 and arriving at the light sensing device will vary as a function time. Note that the term "cumulative" is meant to suggest a summation (spatial integration) over the light portions arriving at the light sensing device at any given time. This summation may be implemented, at least in part, optically (e.g., by means of a lens and/or mirror that concentrates or focuses the light portions onto a concentrated area as described above).

Figure 3B:
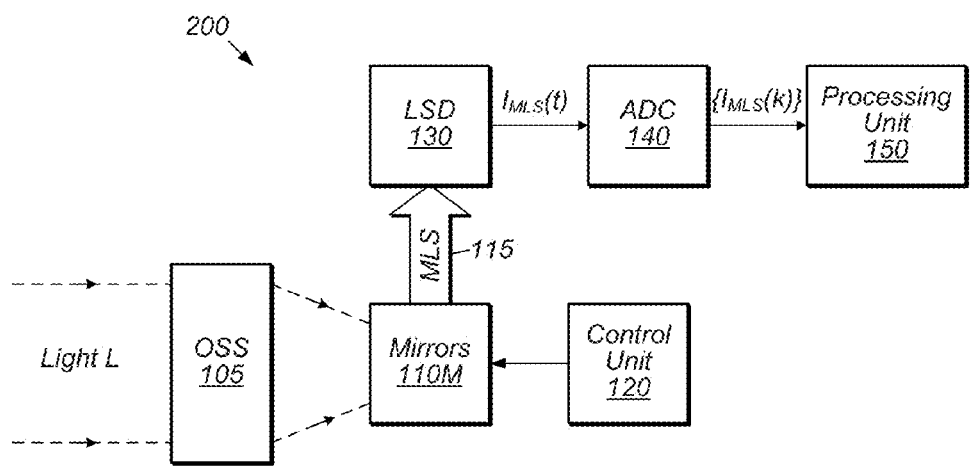
FIG. 3B shows an embodiment of system 200 that includes the processing unit 150.

System realization 200 may include any subset of the features, embodiments and elements discussed above with respect to system 100. For example, system realization 200 may include the optical subsystem 105 to operate on the incoming light L before it arrives at the mirrors 110M, e.g., as shown in FIG. 3B.

Figure 4:
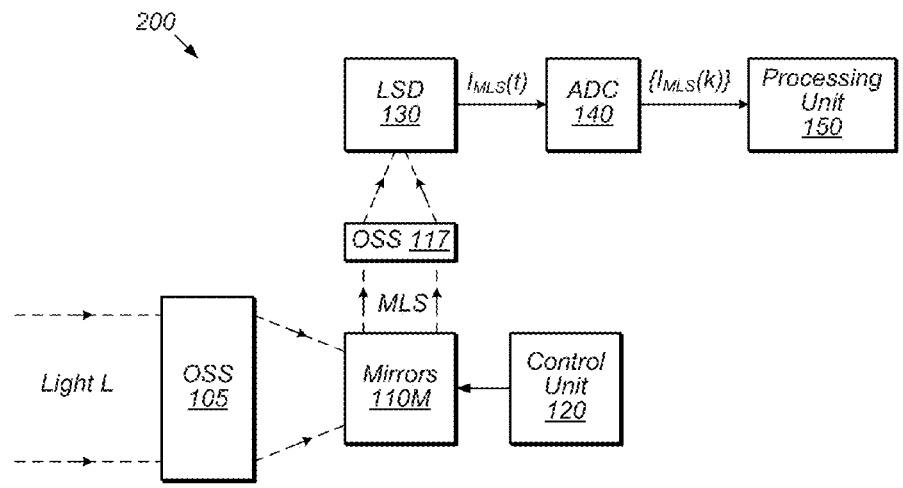
FIG. 4 shows an embodiment of system 200 that includes the optical subsystem 117 to direct or focus or concentrate the modulated light stream MLS onto the light sensing device 130.
Figure 5A:
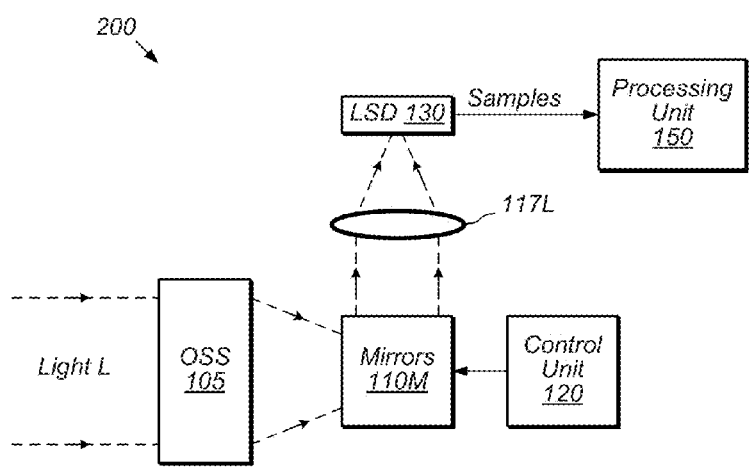
FIG. 5A shows an embodiment of system 200 where the optical subsystem 117 is realized by the lens 117L.

In some embodiments, system realization 200 may include the optical subsystem 117 along the sensing path as shown in FIG. 4. The optical subsystem 117 receives the light portions reflected onto the sensing path 115 and directs (e.g., focuses or concentrates) the received light portions onto a light sensing surface (or surfaces) of the light sensing device 130. In one embodiment, the optical subsystem 117 may include a lens 117L, e.g., as shown in FIG. 5A.

Figure 5B:
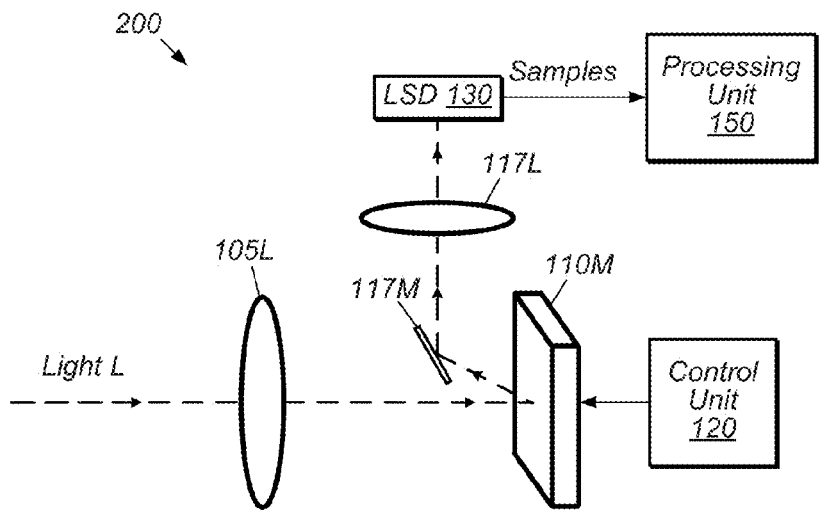
FIG. 5B shows an embodiment of system 200 where the optical subsystem 117 is realized by a mirror 117M and lens 117L in series.

In some embodiments, the optical subsystem 117 may include one or more mirrors, e.g., a mirror 117M as shown in FIG. 5B. Thus, the sensing path may be a bent path having more than one segment. FIG. 5B also shows one possible embodiment of optical subsystem 105, as a lens 105L.

Figure 5C:
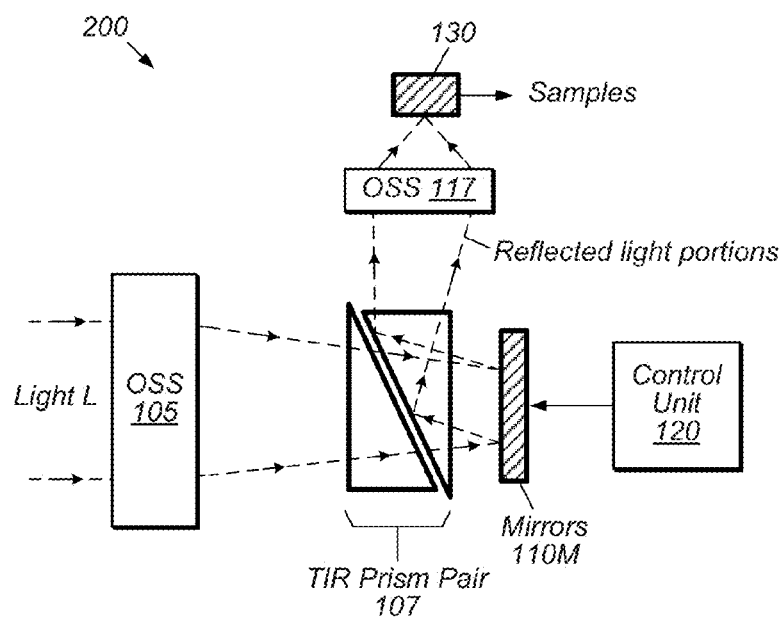
FIG. 5C shows another embodiment of system 200 that includes a TIR prism pair 107.

In some embodiments, there may be one or more optical elements intervening between the optical subsystem 105 and the mirrors 110M. For example, as shown in FIG. 5C, a TIR prism pair 107 may be positioned between the optical subsystem 105 and the mirrors 110M. (TIR is an acronym for "total internal reflection".) Light from optical subsystem 105 is transmitted through the TIR prism pair and then interacts with the mirrors 110M. After having interacted with the mirrors 110M, light portions from mirrors in the first orientation state are reflected by a second prism of the pair onto the sensing path 115. Light portions from mirrors in the second orientation state may be reflected away from the sensing path.

While many of the embodiments described herein involve the modulation of light signals, it should be understood that the principles of the present invention are not limited to light signals. Various embodiments are contemplated where the signals being processed are, e.g., electromagnetic signals or particle beams or seismic signals or acoustic signals or chemical signals or thermal signals or surface waves on a boundary between two fluids or gravitational waves. In each case, a space-time signal is directed to an array of signal-modulating elements whose transmittances or reflectances are individually varied so as to modulate the space-time signal with a time sequence of spatial patterns. The modulated space-time signal may be sensed by a transducer to generate an electrical signal that represents intensity of the modulated space-time signal as a function of time. The electrical signal is sampled to obtain measurements. The measurements may be processed as variously described above to reconstruct an image or sequence of images carried by the original space-time signal.

While many of the embodiments described herein involve the modulation of space-time signals, it should be understood that the principles of the present invention may be applied to signals that are modeled as a real-valued or complex-valued function of time f(t). Signal modulation may be achieved by applying a sequence $\{P_j\}$ of one-dimensional patterns to the signal f(t) to obtain a corresponding sequence $\{S_j\}$ of measurements (inner products). For example, the application of each pattern $P_j$ to the signal f(t) may be modeled by the expression $$S_j = \Sigma_{k=1}^N f(t_k) P_j(k).$$

Sensing with Multiscale Hadamard Patterns

Several aspects of collecting Hadamard measurements and taking full Hadamard transforms are presented below. Some of these ideas are extended to other unitary operations such as the discrete Fourier transform (DFT). The topics discussed include: (a) Review of Permutations and Random Diagonals in Compressive Sensing, and (b) Sensing with Multiscale Hadamard Matrices.

1. Background

The canonical mathematical model for a compressive sensing (CS) scenario is $$y = Ax + e, \quad (1)$$

where the measurements are contained in a length-M column vector y, A is the sensing or measurement matrix of size M×N with M≤N, x is the signal/image being observed contained in a length-N column vector, and e is a length-M column vector that represents noise. A fundamental requirement of CS is for the matrix A to possess some incoherence property with respect to some basis under which the signal is assumed to be sparse.

Once the measurements y are obtained, an algorithm is used to computationally reconstruct an approximate signal/image x*. For example, x* can be found according to optimizing some objective function $$x^* = \mathrm{argmin}_{\hat{x}} [g(\hat{x}) + f(\hat{x}, y)]. \quad (2)$$

For example, in the case of Total Variation (TV) minimization, we use $$g(\hat{x}) = \|\nabla \hat{x}\|_1 \quad (3A)$$

$$f(\hat{x}, y) = \frac{\lambda}{2} \|A\hat{x} - y\|_2^2 \quad (3B)$$

where $\|\nabla \hat{x}\|_1$ is a measure of the gradient of $\hat{x}$, $\|A\hat{x}-y\|_2^2$ is the energy of the fidelity of how well $A\hat{x}$ approximates the measured data y, and λ is a parameter that balances the importance of the two terms.

Incoherence in the sensing matrix is often achieved by injecting, or imposing some form of randomness. For instance, the entries of A are sometimes drawn from a random distribution, such as Gaussian or Bernoulli. However, such pure randomness is very expensive to implement in hardware. Instead, many CS systems use a structured matrix (e.g., a DFT matrix, or a Hadamard transform matrix) that is then perturbed in some pseudo-random way.

Permuting a Structured Matrix

For example, consider an N×N orthogonal matrix H, such as the one used for a Hadamard or discrete Fourier transform. However, we are only interested in utilizing M of its rows, which we obtain with R, the M×N row selector matrix. Since the Hadamard matrix (and similar transform matrices) is extremely structured, a common technique to randomize it is to perform a random reordering of its columns using P, an N×N permutation matrix, and then to choose M of its rows uniformly at random with R. In this case, we can model our sensing matrix as $$A = RHP. \quad (4)$$

To see why reordering the columns of the sensing matrix will invoke incoherence, substitute Equation (4) into (1):

$$y = RHPx = R(HP)x = RH(Px), \quad (5)$$

where the permutation can either be viewed as acting on the columns of the sensing matrix H, or as acting on the elements/pixels of the of signal/image being sensed.

Using a Random Diagonal Matrix

Another way to inject randomness is to randomly reverse the polarity of the columns of H. This can be accomplished by multiplying H with a diagonal matrix D $$D = \begin{bmatrix} d_0 & 0 & & 0 \\ & d_1 & & \\ 0 & & \ddots & 0 \\ & & & \ddots \\ 0 & & 0 & d_{N-1} \end{bmatrix}, d_j \in \{+1, -1\}, \quad (6)$$

whose main diagonal consists of a sequence of elements drawn from the set {+1,−1}. Usually, the {+1,−1} entries of the main diagonal are chosen uniformly at random. Then our sensing matrix has the form $$A=RHD, \quad (7)$$

where R and H are as before. We often refer to D as a "random diagonal."

An attractive aspect of any diagonal matrix with 1s and −1s along the diagonal is that it is equivalent to its inverse and its transpose:

$$D^{-1}=D=D^T. \quad (8)$$

($D=D^T$ is true for any diagonal matrix. But the equality $D^{-1}=D$ relies on the diagonal entries being 1s and −1s.)

Similar to the permutation case above, to see why using a random diagonal will invoke incoherence, substitute Equation (6) into (1):

$$y=RHDx=R(HD)x=RH(Dx), \quad (9)$$

where the random diagonal can either be viewed as acting on the columns of sensing matrix, or as acting on the elements/pixels of the of signal/image being sensed.

Background on Hadamard Matrices

In general, an N×N Hadamard matrix has entries that are +1 or −1, and has rows (and columns) that are mutually orthogonal so that $$H^T H = HH^T = N \cdot I_N,$$

where $I_N$ is the N×N identity matrix. The scalar multiple N is sometimes absorbed into the definition of H so that the entries are $$\frac{+1}{\sqrt{N}} \text{ or } \frac{-1}{\sqrt{N}},$$

which makes H unitary. We adopt the form where the entries are +1 and −1 since it corresponds better to the "on" and "off" binary states of the DMD (or other signal modulation device).

Given two arbitrary Hadamard matrices $H_B$ and $H_F$ of size B×B and F×F, respectively, it is well known that their Kronecker product $H_F \otimes H_B$ results in another Hadamard matrix of size BF×BF, which simply means that all of the +1s in $H_F$ are replaced $+H_B$, and all of the −1s in $H_F$ are replaced with $-H_B$.

For example, the well-known Sylvester-type Hadamard constructions are defined for $N=2^K$, with K=0, 1, 2, . . . :

$$H_1 = [1],$$

$$H_2 = \begin{bmatrix} +1 & +1 \\ +1 & -1 \end{bmatrix},$$

$$H_4 = H_2 \otimes H_2 = \begin{bmatrix} +H_2 & +H_2 \\ +H_2 & -H_2 \end{bmatrix} = \begin{bmatrix} +1 & +1 & +1 & +1 \\ +1 & -1 & +1 & -1 \\ +1 & +1 & -1 & -1 \\ +1 & -1 & -1 & +1 \end{bmatrix}.$$

For general K, we can recursively construct the Sylvester-type Hadamard matrix according to $$H_{2^K} = H_2 \otimes H_{2^{K-1}} = \begin{bmatrix} +H_{2^{K-1}} & +H_{2^{K-1}} \\ +H_{2^{K-1}} & -H_{2^{K-1}} \end{bmatrix},$$

but there are many other flexible strategies, such as $$H_{2^K} = H_4 \otimes H_{2^{K-2}} = H_2 \otimes H_2 \otimes H_{2^{K-2}}$$

$$= \begin{bmatrix} \begin{pmatrix} +H_{2^{K-2}} & +H_{2^{K-2}} \\ +H_{2^{K-2}} & -H_{2^{K-2}} \end{pmatrix} & \begin{pmatrix} +H_{2^{K-2}} & +H_{2^{K-2}} \\ +H_{2^{K-2}} & -H_{2^{K-2}} \end{pmatrix} \\ \begin{pmatrix} +H_{2^{K-2}} & +H_{2^{K-2}} \\ +H_{2^{K-2}} & -H_{2^{K-2}} \end{pmatrix} & \begin{pmatrix} -H_{2^{K-2}} & -H_{2^{K-2}} \\ -H_{2^{K-2}} & +H_{2^{K-2}} \end{pmatrix} \end{bmatrix},$$

or, for some integer L<K:

$$H_{2^K} = H_{2^{K-L}} \otimes H_{2^L},$$

and so on. This highlights the fact that a given Sylvester-type Hadamard matrix has many layers of smaller Sylvester-type Hadamard matrices embedded within it, and thus contains multiple scales.

An attractive aspect of these matrices is that they are symmetric:

$$H_{2^K}^T = H_{2^K}.$$

We can generalize the above discussion to the case of $N=B \cdot 2^K$, where B may or may not be a power of two. (In the case where B is not a power of two, it must be a multiple of four.) Then, assuming that a B×B Hadamard matrix $H_B$ exists, we have the general construction $$H_N = H_{2^K} \otimes H_B, \quad (11)$$

or $$H_N = \begin{bmatrix} +H_B & +H_B & +H_B & +H_B & +H_B & +H_B & \ldots & +H_B \\ +H_B & -H_B & +H_B & -H_B & +H_B & -H_B & \ldots & -H_B \\ +H_B & +H_B & -H_B & -H_B & +H_B & +H_B & \ldots & -H_B \\ +H_B & -H_B & -H_B & +H_B & +H_B & -H_B & \ldots & +H_B \\ +H_B & +H_B & +H_B & +H_B & -H_B & -H_B & \ldots & -H_B \\ +H_B & -H_B & +H_B & -H_B & -H_B & +H_B & \ldots & +H_B \\ \vdots & \vdots & \vdots & \vdots & \vdots & \vdots & \ddots & \vdots \\ +H_B & -H_B & -H_B & +H_B & -H_B & +H_B & \ldots & \ddots \end{bmatrix} = \begin{bmatrix} \mathcal{B}_0 \\ \mathcal{B}_1 \\ \mathcal{B}_2 \\ \mathcal{B}_3 \\ \mathcal{B}_4 \\ \mathcal{B}_5 \\ \vdots \\ \mathcal{B}_{2^K-1} \end{bmatrix}. \quad (12)$$

We see that every block of B consecutive rows in $H_N$ consists of $2^K$ copies of $H_B$ that are repeated column-wise with some polarity pattern; there are $2^K$ of these B×N row-blocks, i.e., the submatrices $\mathcal{B}_k$ shown at the righthand side of equation (12). (Note the different symbol '$\mathcal{B}$' used for these submatrix blocks, as opposed to the simple 'B', which represents a scalar.) Clearly, the polarity pattern is inherited from the rows of the $H_{2^K}$ matrix. It is helpful to think of $H_B$ as a "kernel" B×B matrix, and of its individual rows as the "seeds"

that are groomed into the larger, structured and multiscale matrix $H_N$ by means of matrix $H_{2^K}$.

Within the kernel $H_B$, we can express its ith seed-row, for arbitrary i=0, 1, . . . , B–1, as $$h_i = [h_{i,0} \ h_{i,1} \ h_{i,2} \ldots h_{i,B-1}]. \quad (13)$$

2. Multiscale Hadamard Matrices

In this section, we discuss, among other things, (a) a method for simultaneously collecting CS measurements at multiple scales, and (b) a method for introducing randomness and/or incoherence in Hadamard measurement patterns, which can be realized as mirror patterns on a DMD (or more generally, as patterns of modulation state for an array of signal modulating elements), and easily generated by a digital device such as an FPGA.

Introduction

Better sensing using a permutation and a random diagonal

We propose a new approach to gathering compressive measurements that combines Equations (4) and (7). By using both a permutation and a random diagonal, we have access to a more flexible sensing strategy:

$$A = RHPD, \quad (14)$$

where R, P and D can be co-designed to have varying degrees of structure and/or randomness. In particular, P may be composed of one or more permutation operators. Similarly, D may be composed of one or more "random" diagonals, which contain {+1,−1} entries that are not necessarily chosen at random, and are not necessarily "balanced." The approach outlined in this document focuses on extracting as much low-frequency information as possible, but other criteria are possible.

Assume that H is a Hadamard transform matrix, but other orthogonal operators, such as the discrete Fourier transform apply as well. We take advantage of the multiscale structure of Sylvester-type constructions of the Hadamard transform, and are thus able to collect both coarse- and fine-scale Hadamard measurements at the same time. We can either reconstruct at the coarsest level by applying a single inverse Hadamard, or at higher resolutions using CS techniques. The Hadamard measurements are encoded in such a way so as to agree with the theory of CS. We can also reconstruct the image's higher spatial sequencies or frequencies (e.g., its edges) by applying a single inverse Hadamard to particular blocks $B_k P$ for k>0.

The main idea behind this approach takes advantage of the flexible programming of a digital micromirror device (DMD) or other signal modulating device. If we are interested in a DMD that has N individually programmable mirrors, then we need to use a Hadamard matrix of size N×N or greater. Typically, a randomized row of a Hadamard matrix is reshaped into a 2-D pattern and loaded onto the DMD. (If the Hadamard pattern is too big, then the extra entries are discarded so that the pattern complements the number of mirrors.) The +1 entries of the Hadamard pattern correspond to mirrors in the "on" state, and the −1 entries correspond to mirrors in the "off" state. When observing a scene a photodetector then measures the photons that are reflected from the "on" mirrors of the DMD.

However, the Sylvester-type Hadamard matrices have a great deal of structure; specifically, they have tremendous multiscale structure. This structure can be exploited by assigning/grouping elements of the Hadamard matrix to specific mirrors. Suppose for some integer K that $N = B \cdot 4^K$, and that a Hadamard matrix $H_B$ exists. Then there exists an N×N Hadamard matrix $$H_N = H_{4^K} \otimes H_B \quad (15)$$

or, $$H_N = \begin{bmatrix} +H_B & +H_B & +H_B & +H_B & +H_B & +H_B & \ldots & +H_B \\ +H_B & -H_B & +H_B & -H_B & +H_B & -H_B & \ldots & -H_B \\ +H_B & +H_B & -H_B & -H_B & +H_B & +H_B & \ldots & -H_B \\ +H_B & -H_B & -H_B & +H_B & +H_B & -H_B & \ldots & +H_B \\ +H_B & +H_B & +H_B & +H_B & -H_B & -H_B & \ldots & -H_B \\ +H_B & -H_B & +H_B & -H_B & -H_B & +H_B & \ldots & +H_B \\ \vdots & \vdots & \vdots & \vdots & \vdots & \vdots & \ddots & \vdots \\ +H_B & -H_B & -H_B & +H_B & -H_B & +H_B & \ldots & +H_B \end{bmatrix} = \quad (16)$$

$$\begin{bmatrix} B_0 \\ B_1 \\ B_2 \\ B_3 \\ B_4 \\ B_5 \\ \vdots \\ B_{4^K-1} \end{bmatrix}.$$

(Note that Equations (15)-(16) specify a matrix $H_{4^K}$, while Equations (11)-(12) use a matrix $H_{2^K}$. Also note that our multiscale structure is based on powers of four due to a minimum of downsampling simultaneously by a factor of two in both the horizontal and vertical directions. It is possible to extend this idea to use powers other than four, but more processing will be necessary due to interpolation. Further, if the signal is 1-D, then a scale of powers of two is the most obvious. This includes the case, e.g., when obtaining a 2D Hadamard transform by separately performing a 1D Hadamard transform on each of its rows and columns.) Here the "fine scale" consists of N pixels, and the "coarse scale" of B pixels. First we address how our sensing paradigm captures the coarse scale information, which is primarily due to applying an appropriate permutation operator. Then we discuss how the fine detail is obtained from a CS reconstruction using TV minimization, e.g., the minimization of equation (3).

The Coarse Scale

Assume that our DMD has a native resolution of r rows and c columns of individual mirrors as shown in FIG. 6, and that we want a coarse scale that is downsampled by an overall factor of $$F = 4^K. \quad (17)$$

Once F is fixed, the number of coarse $\sqrt{F} \times \sqrt{F}$ "superpixels" is $$B = \frac{N}{F}. \quad (18)$$

Thus the horizontal and vertical dimensions are each downsampled by a factor of $\sqrt{F} = 2^K$, and the coarse scene will have $R = r/2^K$ rows and $C = c/2^K$ columns as seen in FIG. 7. (We use lowercase r and c here to denote the fine scale, and uppercase letters R and C for the coarse scale. We also assume row-wise majorization, where the pixel indices correspond to rastering across rows. A simple transposition of the image would change the index ordering FIG. 6 shows the DMD's native, fine resolution with N=r×c mirrors/pixels. The boldface numbers on the left and top represent the row and column indices, row and col, respectively. The indexing of the pixels within the grid assumes a row-wise majorization.

FIG. 7 shows the DMD with a coarse grid of B=R×C pixels. The boldface numbers on the left and top represent the coarse row and column indices, respectively. Each of these superpixels is actually a group of $\sqrt{F}\times\sqrt{F}=2^K\times2^K$ mirrors binned together.

Simple Case: K=1

For ease of presentation, assume first that we are only interested in the case of K=1 in equations (15) and (16), i.e., $$H_N = H_4 \otimes H_B \quad (19A)$$

$$H_N = \begin{bmatrix} +H_B & +H_B & +H_B & +H_B \\ +H_B & -H_B & +H_B & -H_B \\ +H_B & +H_B & -H_B & -H_B \\ +H_B & -H_B & -H_B & +H_B \end{bmatrix} = \begin{bmatrix} \mathcal{B}_0 \\ \mathcal{B}_1 \\ \mathcal{B}_2 \\ \mathcal{B}_3 \end{bmatrix} \quad (19B)$$

where the blocks $\mathcal{B}_0, \ldots, \mathcal{B}_3$ are of size B×N. Consider the first block $\mathcal{B}_0$:

$$\mathcal{B}_0 = [H_B\, H_B\, H_B\, H_B], \quad (20)$$

and suppose that we draw an arbitrary row $b_i$ from $\mathcal{B}_0$, where i=0, 1, ..., B−1. Then we can express $b_i$ as the concatenation of four copies of $h_i$ from Equation (13):

$$b_i = [h_i\, h_i\, h_i\, h_i], \quad (21)$$

Note that the jth (column) element of $b_i$ is $$b_{i,j} = h_{i,(j\,mod\,B)}, \quad (22)$$

where j=0, 1, ..., N−1. Expressed differently, for j'=0, 1, ..., B−1, we have $$b_{i,j'} = b_{i,(j'+B)} = b_{i,(j'+2B)} = b_{i,(j'+3B)} = h_{i,j'}. \quad (23)$$

Thus, for fixed row i, there are F=4 identical values of $b_{i,j'}$ due to the modulo structure. Our goal is for these common values to be grouped together into a $\sqrt{F}\times\sqrt{F}=2\times2$ superpixel when the vector $b_i$ is wrapped onto the DMD. This can be achieved by applying an appropriate permutation operator P to the vector $b_i$. Then the permuted vector $b_i$ will wrap onto the DMD such that there will be B coarse superpixels. The j'-th of these coarse superpixels will have value $h_{i,j'}$.

General Case: K≥1

Extending the simple case to general K, block $\mathcal{B}_0$ will contain $F=4^K$ copies of $H_B$:

$$\mathcal{B}_0 = [H_B\, H_B\, H_B\, H_B \ldots H_B], \quad (24)$$

Thus, for any i=0, 1, ..., B−1, we can express an arbitrary row $b_i$ of $\mathcal{B}_0$ as the concatenation of $4^K$ copies of $h_i$ from Equation (13):

$$b_i = [h_i\, h_i\, h_i\, h_i \ldots h_i], \quad (25)$$

Note that the jth (column) element of $b_i$ is still $$b_{i,j} = h_{i,(j\,mod\,B)}, \quad (26)$$

where j=0, 1, ..., N−1. Expressed differently, for j'=0, 1, ..., B−1, we have $$b_{i,j'} = b_{i,(j'+B)} = b_{i,(j'+2B)} = b_{i,(j'+3B)} = \ldots = b_{i,(j'+(4^K-1)B)} = h_{i,j'}. \quad (27)$$

Thus, for fixed row i, there are $F=4^K$ identical values of $b_{i,j'}$ due to this modulo structure. Our goal is for these common values to be grouped together into a $\sqrt{F}\times\sqrt{F}=2^K\times2^K$ superpixel when the vector $b_i$ is reshaped and wrapped onto the DMD as depicted in FIG. 7. This can be achieved by applying an appropriate permutation operator P to the vector $b_i$. (The permutation operator is discussed in a subsequent section.) Then the permuted vector $b_i$ will wrap onto the DMD such that there will be B coarse superpixels. The j'-th of these coarse superpixels will have value $h_{i,j'}$.

Note that the permutation operator may be applied to any row (or any subset of rows) of matrix $H_N$, not just rows from block $\mathcal{B}_0$. However, for a row not in block $\mathcal{B}_0$, Equations (24) through (26) may be generalized as follows. For k=0, 1, 2, ..., F−1, the block $\mathcal{B}_k$ is given by $$\mathcal{B}_k = [H_F(k,0)H_B\, H_F(k,1)H_B\, H_F(k,2)H_B \ldots H_F(k,F-1)H_B], \quad (24B)$$

where $H_F(u,v)$ denotes the $(u,v)^{th}$ element of matrix $H_F$.

For any i=0, 1, ..., N−1, we can express the $i^{th}$ row of $H_N$, denoted $H_N(i)$, as the concatenation of $F=4^K$ appropriately signed copies of row $h_{(i\,mod\,B)}$ from matrix $H_B$. If we define i'=i mod B, and set k=floor(i/B), we have $$H_N(i)[H_F(k,0)h_{i'}, H_F(k,1)h_{i'}, H_F(k,2)h_{i'} \ldots H_F(k,F-1)h_{i'}]. \quad (25B)$$

Note that the jth (column) element of row $H_N(i)$ is now $$H_N(i,j) = H_F\left(k, \text{floor}\left(\frac{j}{B}\right)\right) \times h_{i',(j\,mod\,B)}, \quad (26B)$$

where j=0, 1, ..., N−1.

Recovering the Coarse Scale

Temporarily suppose all $d_j=+1$ in Equation (6) so that $D=I_N$, the N×N identity matrix, which means that we are really implementing the sensing matrix in Equation (4) instead of (14). (We do this to focus on the effect of the coarse scale achieved with the permutation P). Assume that we take M measurements, collectively represented by the expression $$y = RH_N Px. \quad (28)$$

It should be clear that if the row selector R only permits block $\mathcal{B}_0 P$ of $H_N P$ to be measured, then M=B and the elements of y will contain the B coarse scale Hadamard measurements (up to a scale factor, which we ignore for now) corresponding respectively to the B rows of $H_B$. The coarse scale image can then be recovered by applying a single and fast inverse Hadamard transform $H_B^T$:

$$\hat{x}_{coarse} = H_B^T y. \quad (29)$$

We sometimes refer to this type of reconstruction as a simple "low-resolution preview" mode.

M/N Ratio

In some embodiments, an image acquisition may be based on the B rows of block $\mathcal{B}_0$. Thus, the number M of spatial patterns applied to light stream (incident upon the DMD, or other signal modulator) is equal to B: M=B=N/F. The so-called "data capture" ratio of measurements to number of image pixels is simply $$\frac{M}{N} = \frac{N/F}{N} = 4^{-K}. \quad (30)$$

For example, when K=1, then F=4, and so M/N=0.25; when K=2, we have F=16, and so M/N=0.0625, etc.

The Permutation Operator

For illustration, assume the simplest case where the number of rows and columns on the DMD are powers of two. (A similar approach can be taken when the number of pixels is not a power of two, e.g., when the factor B is not a power of two.) Assume that $$r=2^I, c=2^J,$$

downsample factor $F=4^K$, and $B=N/F$, for some appropriate integers I, J, K, (with both I, J≥K), and that the N-pixel image is represented as a (row-majorized) column vector. Since there are $N=r \cdot c=2^{I+J}$ pixels, we can encode each pixel index with exactly I+J bits. Consider an arbitrary pixel j in a particular row and column of the DMD of FIG. 6, with indices row and col, respectively. (Note that we use the index j, which corresponds to the jth column element of an arbitrary row of $H_N$.) The (I+J)-bit binary value for the corresponding pixel index in this cell is the concatenation $$j_{bin}=[row_{bin}, col_{bin}] \tag{31}$$

where $row_{bin}$ and $col_{bin}$ are the I-bit and J-bit binary representations of row and col, respectively. Specifically, the I bits of $row_{bin}$ can be separated into its first K bits, and remaining I-K bits:

$$row_{bin}=(\langle \beta_{I-1}, \ldots, \beta_K \rangle, \langle \beta_{K-1}, \ldots, \beta_0 \rangle) \tag{32}$$

and the J bits of $col_{bin}$ can be separated into its first K bits, and remaining J-K bits:

$$col_{bin}=(\langle \beta_{J-1}, \ldots, \beta_K \rangle, \langle \beta_{K-1}, \ldots, \beta_0 \rangle) \tag{33}$$

where the first bit (on the right), $\beta_0$, is the least significant bit (LSB), and the last bit (on the left) is the most significant bit (MSB).

Then for any j=0, . . . , N−1, we can partition its binary form into these four groups of bits (denoted by the angle brackets 〈•〉) by substituting Equations (32) and (33) into (31):

$$j_{bin} = [\langle \beta_{J+I-1}, \ldots, \beta_{J+K} \rangle, \langle \beta_{J+K-1}, \ldots, \beta_J \rangle, \tag{34}$$

$$\langle \beta_{J-1}, \ldots, \beta_K \rangle, \langle \beta_{K-1}, \ldots, \beta_0 \rangle]$$

$$= [\langle \text{Group 3} \rangle, \langle \text{Group 2} \rangle, \langle \text{Group 1} \rangle, \langle \text{Group 0} \rangle]$$

Notice that due to the concatenation, the bits of $row_{bin}$ have been renumbered to agree with being the top/bits of the (I+J)-bit sequence.

There are many possible permutations of the bits in Equation (34). One preferred embodiment that complements the above discussion of grouping common values into a $2^K \times 2^K$ superpixel would simply permute the 4 groups of bits contained in the angle brackets without permuting bits inside the groups. Thus, if we let $\rho_i$ denote the arbitrary $i^{th}$ row of the matrix $H_N$, and $\rho'_i$ denote the resulting permuted row, then the permutation operates so that the jth element of the permuted row $\rho'_i$ is assigned the value of the $P(j)^{th}$ element of the row $\rho_i$:

$$\rho'_i(j)=\rho_i(P(j)),$$

where $$P(j) = [\langle \beta_{J+K-1}, \ldots, \beta_J \rangle, \langle \beta_{K-1}, \ldots, \beta_0 \rangle, \tag{35}$$

$$\langle \beta_{J+I-1}, \ldots, \beta_{J+K} \rangle, \langle \beta_{J-1}, \ldots, \beta_K \rangle]$$

$$= [\langle \text{Group 2} \rangle, \langle \text{Group 0} \rangle, \langle \text{Group 3} \rangle, \langle \text{Group 1} \rangle].$$

Since the groups of bits that are swapped are not necessarily the same length, we see that, in general, this is not a simple two-cycle permutation. However, notice that permuting the all-zeros bit string will again be all zeros:

$$P(0)=P([0, \ldots, 0])=[0, \ldots, 0]=0, \tag{36}$$

and similarly the all-ones bit string will again be all ones:

$$P(N-1)=P([1, \ldots, 1])=[1, \ldots, 1]=N-1, \tag{37}$$

which means that these indices are fixed. (In other words, the first pixel and the last pixel in the DMD are fixed by the permuation.)

For example, let I=3, J=4, and K=2. This corresponds to an image of size $N=8 \times 16=128$ pixels, and a downsample factor of $F=4^2=16$. The row-majorized indices j=0, . . . , 127 are shown in the cells in FIG. 8. To the left and above, in boldface, are the binary representations of the 8 rows and 16 columns, with 3 bits to represent each row index $row_{bin}$ and 4 bits to represent each column index $col_{bin}$.

Figure 8:
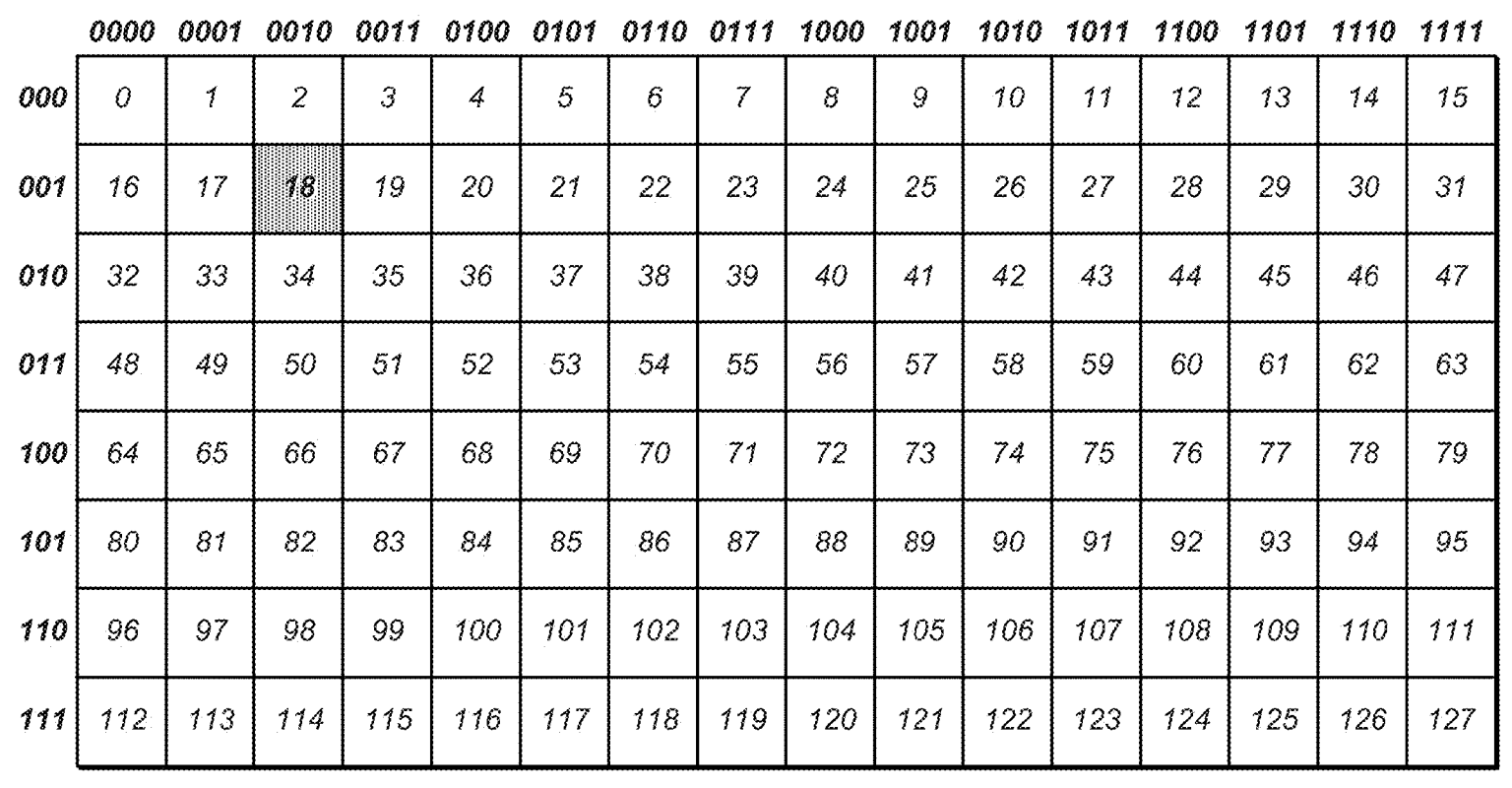

Typically, we would take a 128×128 Hadamard matrix $H_{128}$, and wrap one of its rows onto the DMD (i.e., onto the array of mirrors in the DMD). For a given row, its jth (column) element would be placed into the jth cell of the DMD in the same way as shown in FIG. 8. However, with the method above, we can permute the columns of $H_{128}$ by applying the operator P, and then sense with the first B=N/F=8 rows (i.e., the block $B_0 P$) to obtain the coarse scale information. Applying the operator P to the columns of $H_{128}$ is equivalent to permuting the binary representation of the columns indices with Equation (35).

Since our downsample factor is $F=4^2=16$, then we will have B=8 superpixels arranged as a coarse 2×4 image, where each superpixel is 4×4. This is shown below in FIG. 9, where the superpixels have bold edges. Note that each of the rows of non-permuted block $B_0$ will have identical values at column indices 0, 8, . . . , 112, 120, and so those column indices are grouped into the first superpixel. Similarly, indices 1, 9, . . . , 113, 121 correspond to the second superpixel, . . . , and indices 7, 15, . . . , 119, 127 correspond to the eighth superpixel.

FIG. 8 shows a DMD with $N=8 \times 16=128$ pixels, where indices j=0, . . . , 127 are rastered row-wise. The 3-bit binary values of the 8 rows and 4-bit binary values of the 16 columns are shown in bold on the borders. The highlighted index has binary representation $$[row_{bin}, col_{bin}]=[(001),(0010)]=[0010010]=16+2=18.$$

FIG. 9 shows permuted indices of the N=128 pixels in FIG. 8. These indices now correspond to the elements (i.e., the column indices) of the rows of the Hadamard matrix $H_{128}$. Every group of 4×4 mirrors has the same value, and represents a coarse, superpixel, which has a bold border. Compare highlighted index 48 in $row_{bin}$=001, and $col_{bin}$=0010 with the same location in FIG. 8.

To see how the permutation operator works on a specific index, consider the arbitrary pixel location j=18 in FIG. 8, which has been highlighted in boldface. This pixel location corresponds to the second row ($row_{bin}$=001) and third column ($col_{bin}$=0010). But since K=2, we partition the 2 lower bits of both of the bit sequences from the rest so that $$row_{bin}=(\langle 0 \rangle, \langle 0,1 \rangle) \text{ and}$$

$$col_{bin}=(\langle 0,0 \rangle, \langle 1,0 \rangle).$$

Thus, concatenating these two binary values as $[row_{bin}, col_{bin}]$ in the form of in Equation (34) with I=3, J=4, and K=2, gives us the unique binary sequence and equivalent decimal value:

$$j = [\langle\langle 0\rangle, \langle 0, 1\rangle\rangle, \langle\langle 0, 0\rangle, \langle 1, 0\rangle\rangle] \qquad (38)$$

$$= [0010010] = 16 + 2 = 18.$$

According to Equation (35) we permute the four groups of bits in the angle brackets and obtain $$P(18) = [\langle 0, 1\rangle, \langle 1, 0\rangle, \langle 0\rangle, \langle 0, 0\rangle] \qquad (39)$$

$$= [0110000] = 32 + 16 = 48.$$

Thus index j=18 on the DMD should be assigned the value contained in (column) index P(18)=48 of the selected row of $H_{128}$. Also notice from Equations (36) and (37) that index j=0 and j=127 are in the same position in FIGS. 3 and 4.

Figure 10A:
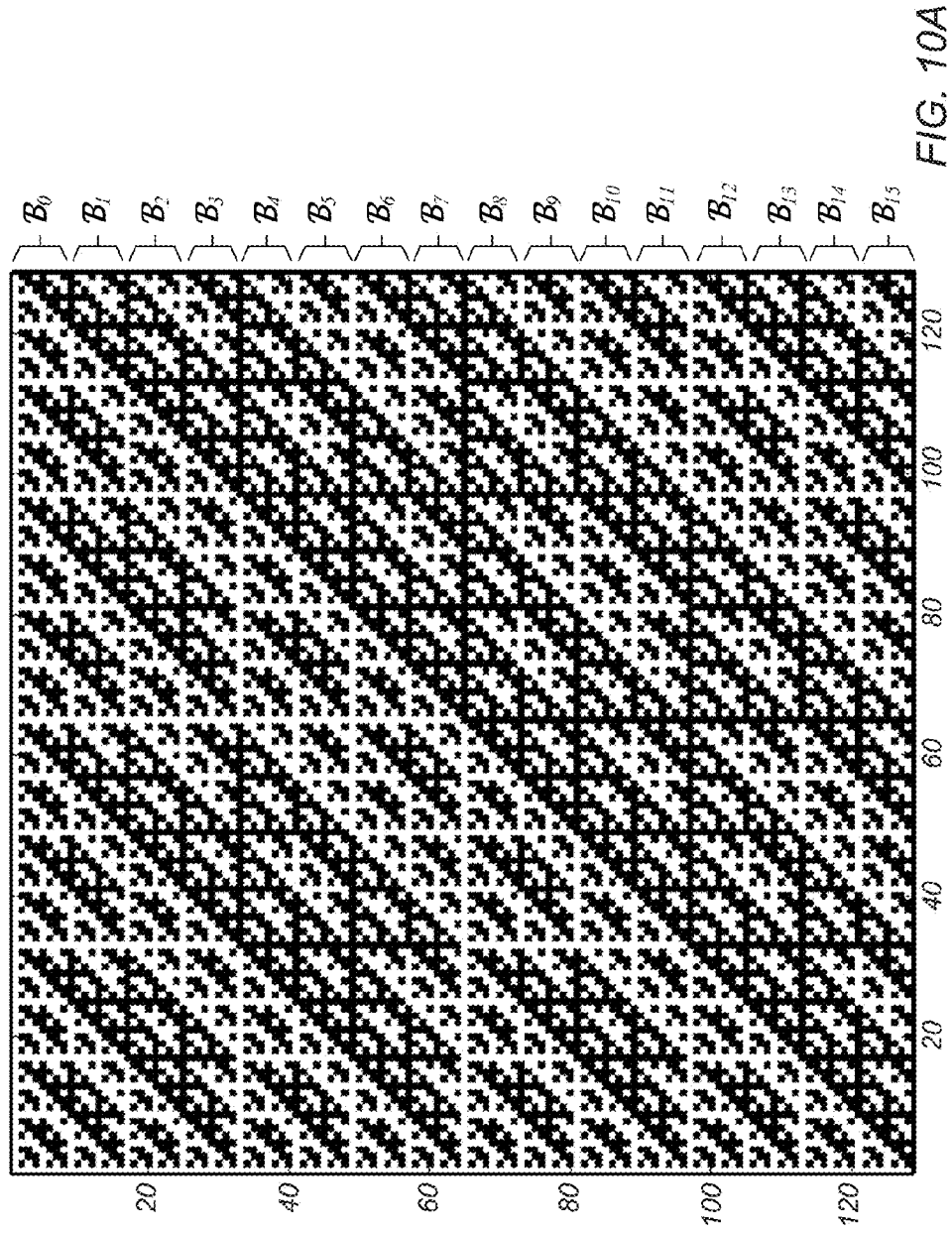
FIGS. 10A and 10B illustrate the action of a permutation P on the columns of the Hadamard matrix $H_{128}$.
Figure 10B:
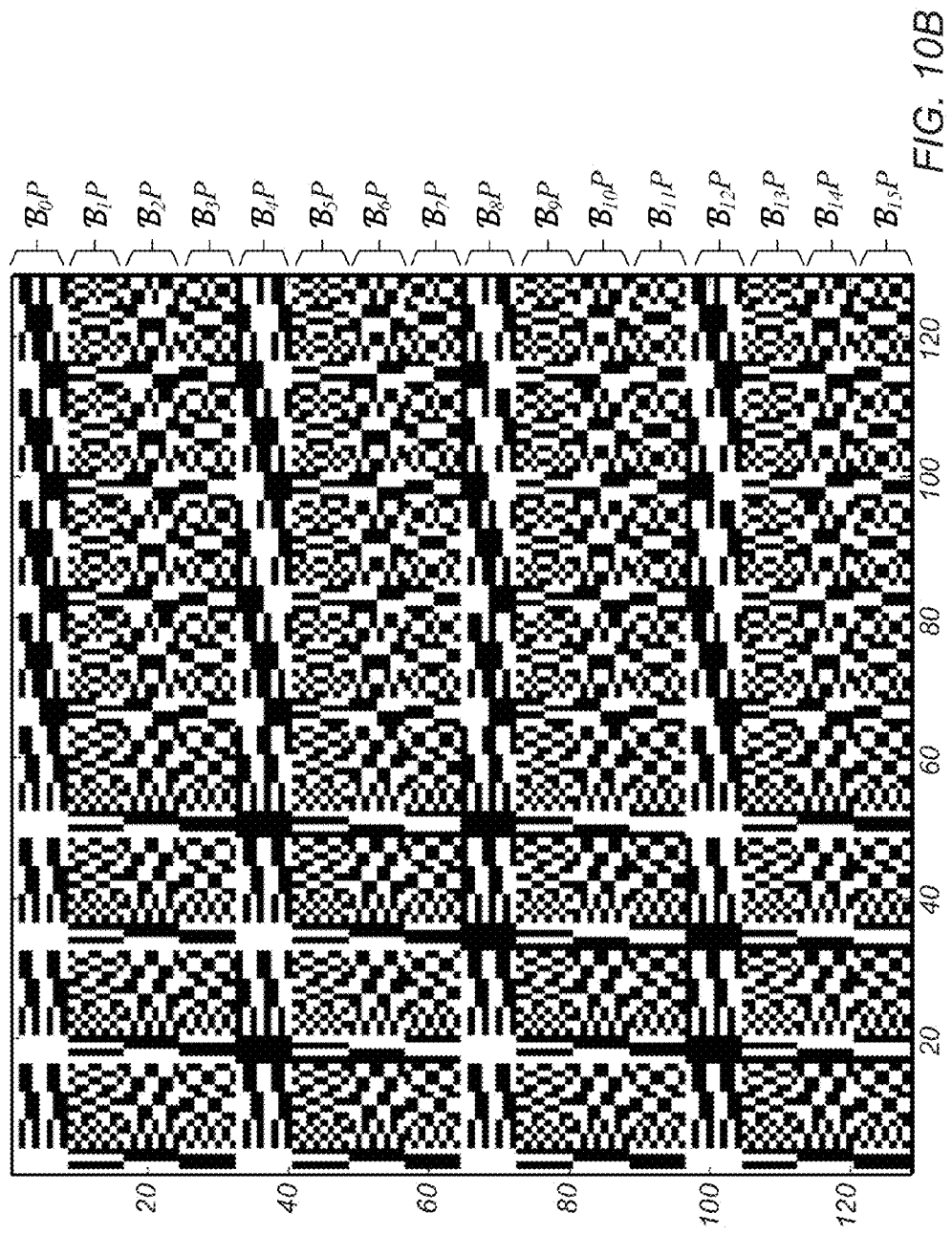

FIGS. 10A and 10B illustrate the action of the permutation P on the matrix $H_{128}$. FIG. 10A illustrates the matrix $H_{128}$. Note the 16 blocks of 8×128 submatrices, denoted $B_0, B_1, \ldots, B_{15}$. Each plus one value in $H_{128}$ is represented as a 1×1 white square. Each minus one value in $H_{128}$ is represented as a 1×1 black square. FIG. 10B shows the permuted matrix $H_{128}P$, where the permutation P has reordered the columns of $H_{128}$ such that each row of the first permuted block (i.e., $B_0P$) will generate a coarse pattern that contains 4×4 superpixels on the 8×16 DMD shown in FIG. 9. (In other words, each coarse pattern will have the property that the 16 pixels within each superpixel will agree, i.e., take the same value, either plus one or minus one.) The 16 permuted blocks are denoted $B_0P, B_1P, \ldots, B_{15}P$.

An Extra Twist

If necessary another permutation operator can be combined that permutes the indices within each superpixel. Since the Hadamard values within each superpixel are the same for rows chosen from $B_0P$, the coarsely measured data of the scene remains the same. But now an extra level of incoherence can be achieved (since this would cause an extra degree of "scrambling" the locations of the scene's pixels in the reconstruction phase). Deterministic or random permutations within each superpixel can be performed, and they can be unique or the same for all superpixels.

Finer Coarse Scales

The same idea can be carried out for other scales that are finer than the coarsest scale. For example, in this case, each superpixel could be split up into four 2×2 smaller blocks. After sensing the B=8 measurements with block $B_0P$, we can also sense with blocks $B_kP$:

$k=F/2^{K+1}=16/8=2$ $k=F/2=16/2=8$ $k=F/2^{K+1}+F/2=2+8=10$

Thus gathering B=8 measurements from each of blocks $B_0P$, $B_2P$, $B_8P$, $B_{10}P$ would yield 32 total measurements. This is equivalent Hadamard data as if we had instead used a downsample factor of $F=4^1$, and used K=1 in the permutation operator, which would have resulted in the first block $B_0P$ of size 32×128. In this case, we would have simply sensed with the B=32 rows of $B_0P$, and there would have been B=N/F=128/4=32 explicit smaller superpixels of size 2×2. For general values of K there may be multiple sets of scales to probe into, and the above procedure can be continued from superpixel scale $2^K \times 2^K$ to some desired finer scale $2^L \times 2^L$, where positive integer L<K. In this general case a total of $4^{K-L}$ blocks $B_kP$ would need to be sensed to get to scale $2^L \times 2^L$. That is, after obtaining the initial B measurements associated with $B_0P$, one would need to gather the measurements associated with appropriate ($4^{K-L}-1$) other blocks $B_kP$. It is a straightforward generalization (of the above case where we have K=2 and L=1) to determine the appropriate indices of k=F-1, ..., F-1 of the blocks $B_kP$.

In this sense, once we set a large superpixel, if we then collect enough measurements beyond the block $B_0P$, then we will have access to multiple scales of Hadamard data.

Including a Random Diagonal

If necessary, a random diagonal D can be included in the measurements process $$y = RH_N PDx. \qquad (40)$$

Figure 11:
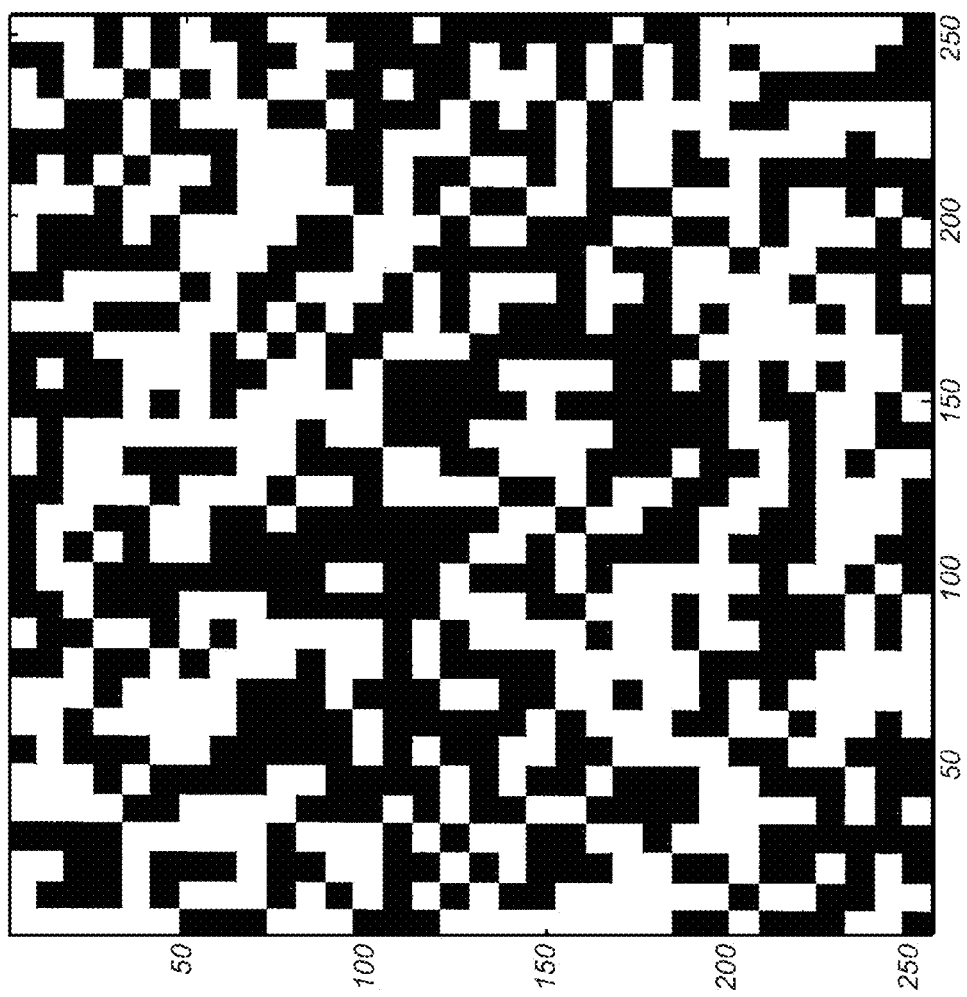
FIG. 11 illustrates the diagonal of a coarse-scale diagonal matrix reshaped into the pixel domain, assuming a 256×256 array of light modulating elements.

For example, $$D = D_{coarse} \cdot D_{fine}, \qquad (41)$$

where $D_{coarse}$ contains coarse-scale sign inversions, and $D_{fine}$ contains fine-scale sign inversions. Let $D_B$ be a B×B random diagonal matrix consisting of B random +/−1s. Then we define $D_{coarse}$ as the N×N random diagonal that is the upsampled (by a factor of F) version of $D_B$, such that each of the original +/−1s now correspond to a $\sqrt{F} \times \sqrt{F}$ superpixel mentioned above. (In other words, each of the B values on the diagonal of $D_B$ is assigned to F positions on the diagonal of $D_{coarse}$, where those F positions correspond to a respective one of the B superpixels.) Because of this, $D_{coarse}$ only has B degrees of "randomness." For example, if $F=4^3$, then the superpixels are of size 8×8. FIG. 11 contains a random diagonal reshaped into the pixel domain (assuming a 256×256 image), with $D=D_{coarse}$. It shows the coarse-scale random 8×8 superpixel inversion without any fine-scale randomness. So $D_{fine}=I_N$, the identity matrix.

In contrast, $D_{fine}$ is designed so that there are random fine-scale polarity inversions within each of the $\sqrt{F} \times \sqrt{F}$ superpixels. However, we don't want the number of inversions, numInv, to be too great. Otherwise, the average energy in each superpixel will sum to zero. This will destroy our ability to do a low-resolution preview, and also slows down the reconstruction algorithm since the first best guess $\hat{x}_0$ will be based on measured data that has zero energy, i.e., $\hat{x}_0$ will consist mostly of black pixels. This demands that the ratio $$\frac{numInv}{F} < \frac{1}{2}. \qquad (42)$$

In another example using $F=4^3$, suppose that we wanted each 8×8 superpixel to contain numInv=16 random fine-scale sign flips. This corresponds to a ratio $$\frac{numInv}{F} = \frac{1}{4}.$$

Figure 12:
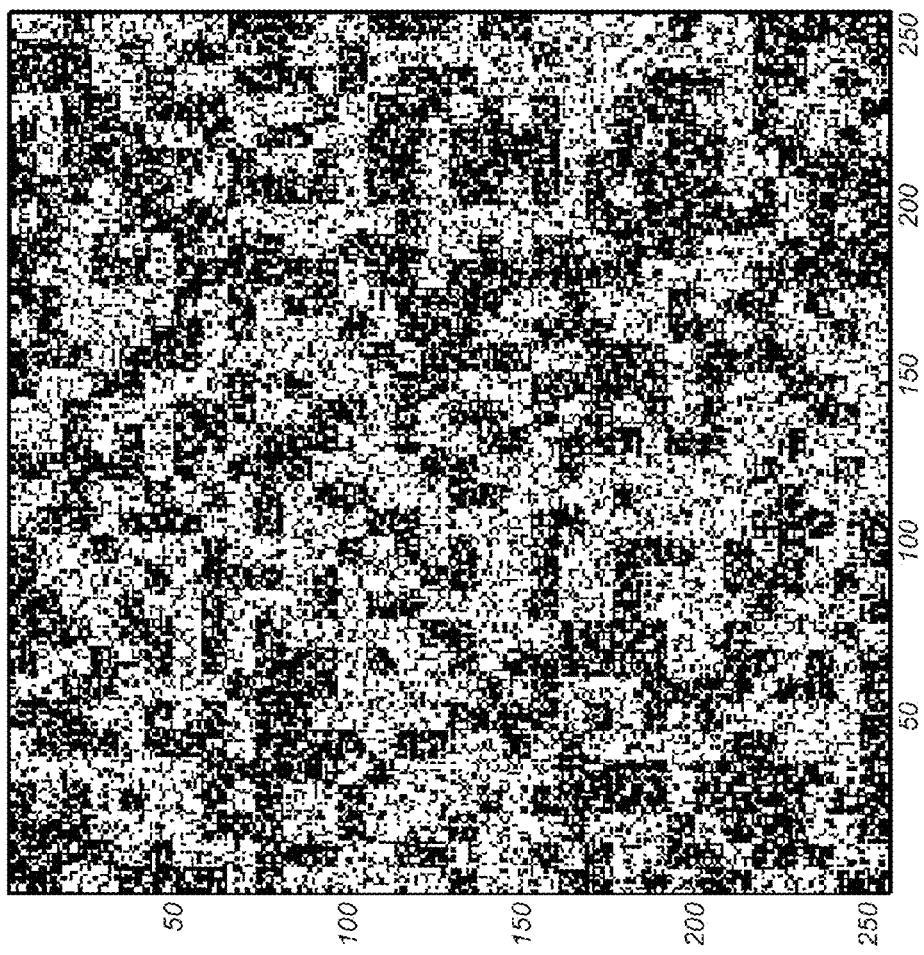
FIG. 12 illustrates the diagonal of a fine-scale diagonal matrix reshaped into the pixel domain, where there are 16 randomly selected sign flips in each 8×8 superpixel.
Figure 13:
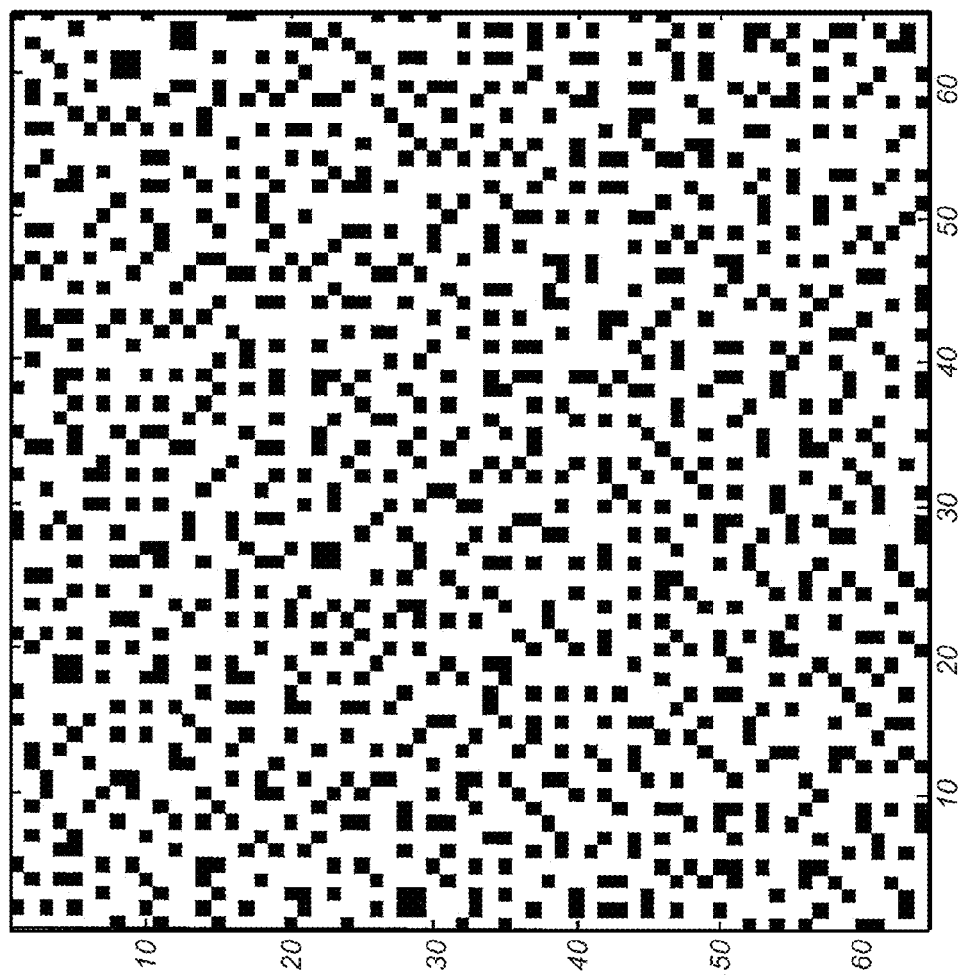
FIG. 13 illustrates the diagonal of a fine-scale diagonal matrix reshaped into the pixel domain, assuming a 64×64 array of light, where the distribution of sign flips is uniform at each scale of $2^l \times 2^l$ shown here for l=1, ..., 6.

The locations could be chosen uniformly at random within the 8×8 DMD block, as seen in FIG. 12. Or, we could target a distribution of sign flips that is uniform at each scale of $2^l \times 2^l$ for l=1, ..., K. (An example of this is shown in FIG. 13, however without the coarse pixel inversion, so $D_{coarse}=I_N$.) In this case, there would be one random sign flip within each 2×2 block. There are 16 of these 2×2 blocks within the larger 8×8 block, so overall this would achieve an even distribution of 16 sign inversions. Moreover, it also permits a consistency over multiple scales. In this example, when viewed at the 2×2 scale there is 1 bit of random inversion within the 4 pixels, so the ratio is 1/4. At the 4×4 scale, there are 4 blocks of 2×2, so there are 4 bits of random inversion within these 16 pixels, so the ratio is again 4/16=1/4. And on the 8×8 scale the ratio is 16/64=1/4. Note, the same fine pixel pattern can be inverted within each 2×2 block, or it can be randomly chosen. The latter tends to give better results, but the former is easier to implement in hardware. Similarly, the fine-scale inversion pattern can be repeated for each of the B superpixels, or each one can have its own instance of fine-scale randomness. Again, the latter approach gives better results, but is computationally more complex to implement.

Note that the coarse diagonal $D_{coarse}$ may be especially useful when the first block $\mathcal{B}_0 P$ is partially sampled, and a CS reconstruction algorithm is being used to reconstruct a coarse-scale image. Moreover, for general signals of non-zero mean (e.g., images), the coarse diagonal $D_{coarse}$ serves to reduce the dynamic range of the measurements obtained when sensing with the rows of the first block $\mathcal{B}_0 P$. (It may also serve to balance the dynamic range across all the blocks $\mathcal{B}_0 P, \mathcal{B}_1 P, \ldots, \mathcal{B}_{F-1} P$.)

Recovering the Coarse Scale (Revisited)

In terms of recovering the coarse scale information from the B Hadamard measurements, if we used a coarse random diagonal $D_{coarse}$ in the sensing step, then we simply have to extend the idea in Equation (29) by also applying $D_B^T = D_B$ after applying the inverse Hadamard transform:

$$\hat{x}_{coarse} = D_B H_B^T y_{0:B-1}. \quad (44)$$

Here, $D_B$ is a B×B random diagonal matrix whose main diagonal consists of the same sequence of $\{+1/-1\}$ that was used to generate the upsampled $D_{coarse}$, which was used to invert the sign of the superpixels.

FIG. 11 shows an example of a random diagonal $D = D_{coarse}$ (with no fine-scale inversion, i.e., $D_{fine} = I_N$), reshaped into a random mask. The coarse scale consists of randomly alternating 8×8 superpixels.

FIG. 12 shows an example of a random diagonal $D = D_{coarse} \cdot D_{fine}$ reshaped into a random mask. The coarse scale consists of randomly alternating 8×8 superpixels. Within each superpixel there are 16 fine-scale inversions chosen uniformly at random. Each superpixel has a different instance of fine-scale inversion.

FIG. 13 shows a close-up of random diagonal $D = D_{fine}$ (with no coarse pixel inversion, i.e., $D_{coarse} = I_N$), reshaped into a random mask. Every group of 2×2 pixels contains a single sign inversion, chosen uniformly at random. Therefore, regardless of scale, every $2^i \times 2^i$ block of pixels has a $\frac{1}{4}^{th}$ of its pixels randomly inverted.

Results

Figure 14:
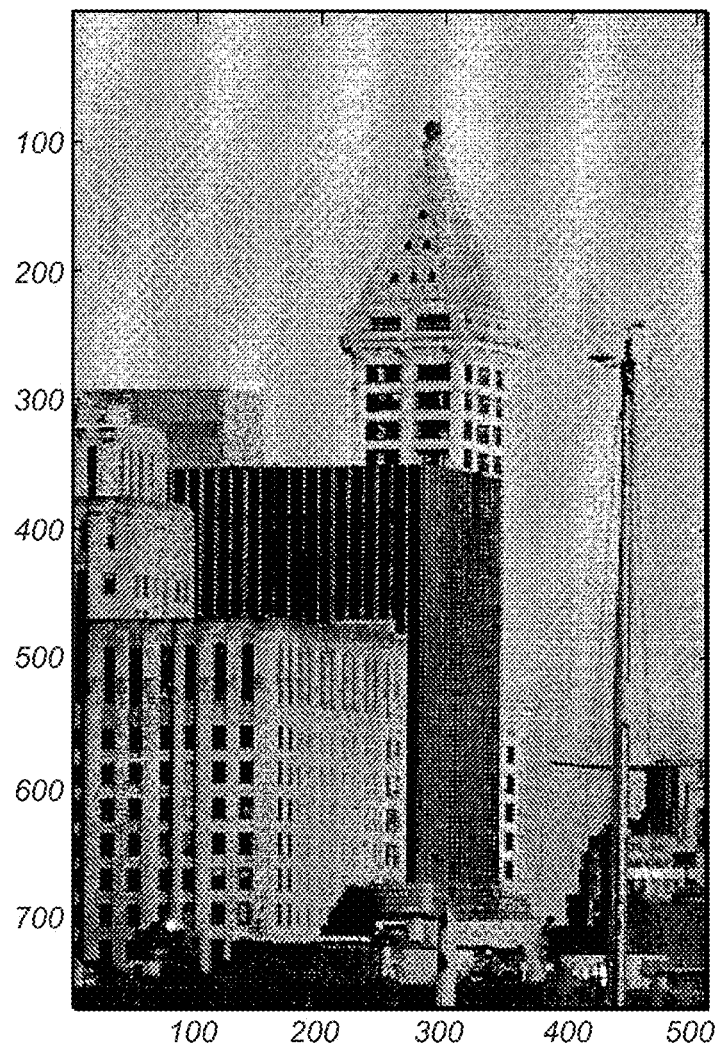
FIG. 14 is an image used as ground truth for a number of simulation examples.

Consider the Harbor scene of size 786×512 shown in FIG. 14. We will use this as the ground truth test image x in the simulated examples.

FIGS. 15A-F compare the results of this new method with a typical compressive sensing (CS) approach. In the new method, we collect measurements according to $$y_{new} = RHPD_x, \quad (45)$$

where the row selector R chooses the first $M = B = N/F = N/2^K$ rows of HPD, and where $D = D_{coarse}$ for this example. Regular CS collects measurements according to $$y_{cs} = RHD_x, \quad (46)$$

where R selects rows of HD uniformly at random, and where D is a fine-scaled random diagonal, e.g., as described in Equation (6).

Figure 15A:
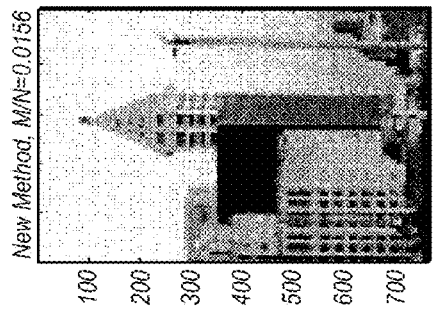
FIGS. 15A-F compare the results of one embodiment of the presently-disclosed method with a typical compressive sensing (CS) approach.
Figure 15B:
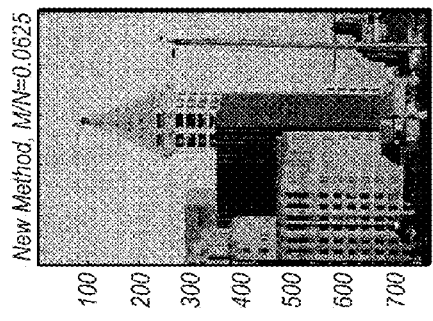
Figure 15C:
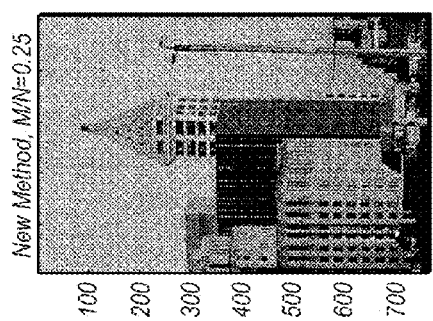

FIGS. 15A-C show the results of collecting M=B measurements with the new method, for K=1, 2, 3. Thus, from Equation (30) we have three results for three ratios: $M/N = 4^{-K}$.

Figure 15D:
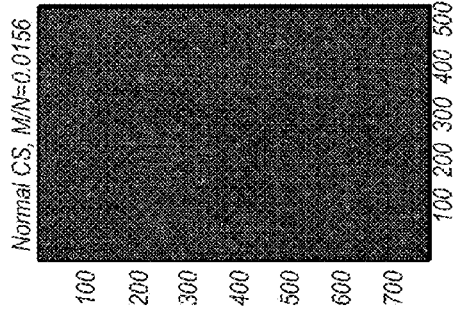
Figure 15E:
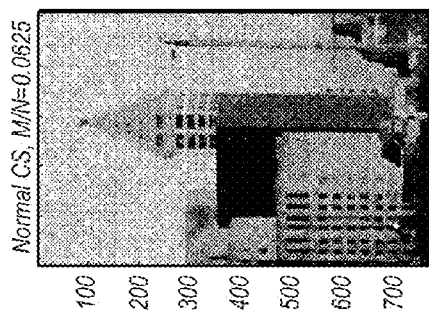
Figure 15F:
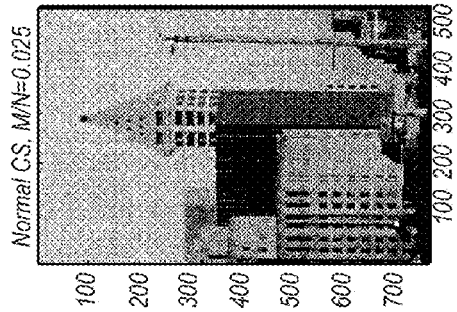

FIGS. 15D-F shows the results of collecting the same number of M measurements in the typical CS style.

Both methods used the same TV minimization algorithm to reconstruct the scene. (TV is an acronym for "total variation".) FIGS. 15A-C illustrate the new data collection method. FIGS. 15D-F illustrate the typical CS data collection method. (Left) M/N=0.25; (Center) M/N=0.0625; (Right) M/N=0.0156. Both methods used the same TV algorithm to reconstruct the image.

Figure 16:
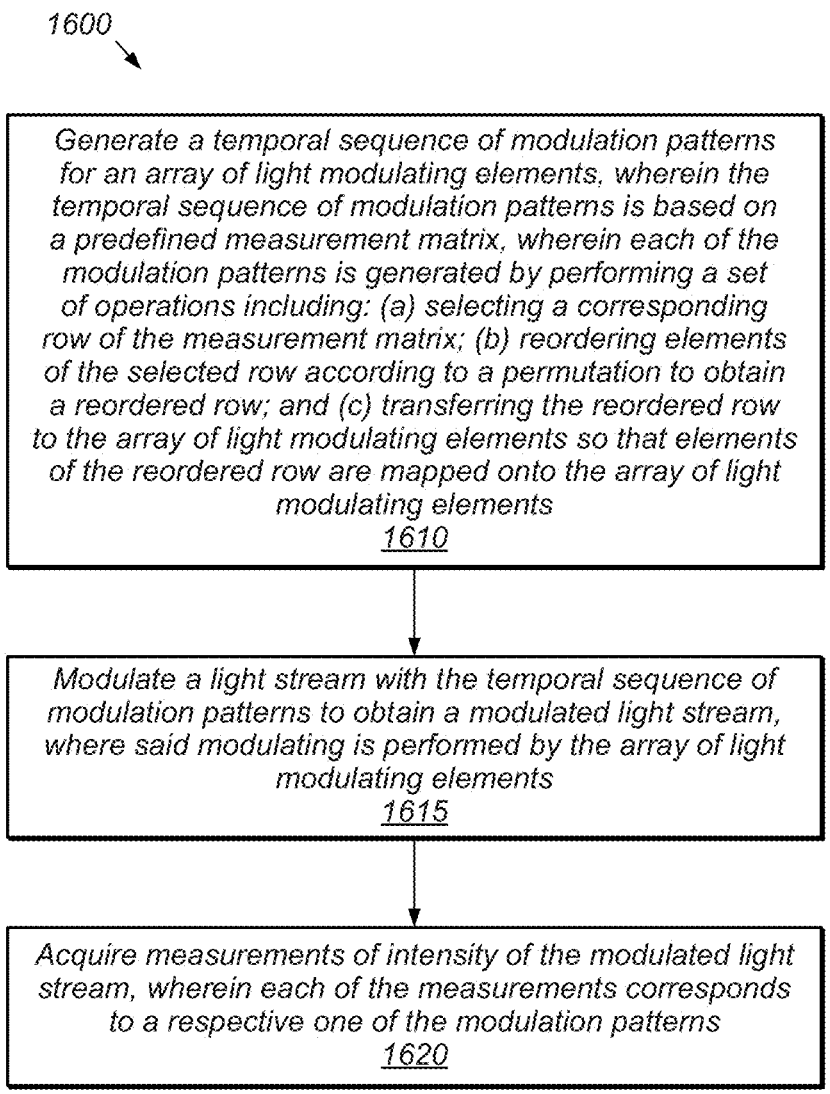
FIG. 16 illustrates one embodiment of a method for acquiring measurements of an image at one or more scales of resolution.

In one set of embodiments, a method 1600 may include the operations shown in FIG. 16. (The method 1600 may also include any subset of the features, elements and embodiments described above.) The method 1600 may be used to generate modulation patterns for acquiring image information at one or more scales of resolution.

At 1610, a temporal sequence of modulation patterns may be generated for an array of light modulating elements, where the temporal sequence of modulation patterns is based on a predefined measurement matrix. Each of the modulation patterns specifies an array of modulation values to be applied by the array of light modulating elements. For example, the modulation values may correspond to the light modulating elements in a one-to-one fashion, i.e., each of the modulation values specifying a modulation state for a corresponding one of the light modulating elements.

The action of generating the modulation patterns is performed by digital circuitry (e.g., by the processing unit 150 described above). Each of the modulation patterns is generated by performing a set of operations including: (a) selecting a corresponding row of the measurement matrix; (b) reordering elements of the selected row according to a permutation to obtain a reordered row; and (c) transferring the reordered row to the array of light modulating elements so that elements of the reordered row are mapped onto the array of light modulating elements. (In some embodiments, the transferring operation (c) may be performed using the teachings of U.S. Provisional Application No. 61/759,003, filed on Jan. 31, 2013, entitled "Harmonically Related Rows of Kronecker-Product Matrices", invented by Matthew A. Herman, which discloses an efficient mechanism for transferring modulation patterns to a signal modulation device in the situation where the modulation patterns are derived from rows of a Kronecker-product matrix.)

The permutation is defined so that a subset $S_1$ of the modulation patterns are coarse patterns that respect a partition of the array of light modulating elements into an array of superpixels, where each of the superpixels includes a respective group of the light modulating elements. In some embodiments, each of the superpixels may include the same number F of light modulating elements, e.g., as variously described above. By saying that a coarse pattern "respects a partition of the light modulating array into an array of superpixels", we mean that the coarse pattern specifies modulation values so that the modulation values within each superpixel agree with each other.

At 1615, a light stream is modulated with the temporal sequence of modulation patterns to obtain a modulated light stream. The action of modulating the light stream is performed by the array of light modulating elements. The array of light modulating elements may be included in the light modulation unit 110 as variously described above. Each of the light modulating elements corresponds to a respective pixel in an image that is carried within the light stream.

It should be understood that the action 1610 of generating the modulation patterns and the action 1615 of modulating the light stream may be performed in parallel or partially in parallel. For example, the generation and the modulation may be performed in a pipelined fashion, where the light modulating array applies a current modulation pattern to the light stream while the digital circuitry is generating a next pattern of the temporal sequence.

At 1620, measurements of intensity of the modulated light stream are acquired, where each of the measurements corresponds to a respective one of the modulation patterns. The measurements may be acquired using a light sensing device, e.g., the light sensing device 130 variously described above. The measurements may be used to perform any of a variety of tasks. For example, the measurement may be used to estimate an image corresponding to a snapshot of the light stream. As another example, the measurements may be used to detect an event occurring in the external environment. As yet another example, the measurements may be used to identify (or classify) an object occurring in the external environment.

In some embodiments, the modulation patterns are 2D modulation patterns, and the array of light modulating elements is a two-dimensional array. Thus, the action of transferring the reordered row to the array of light modulating elements may include wrapping the elements of the reordered row onto the 2D array of light modulating elements, e.g., in a row major order, or alternatively, in a column major order.

In some embodiments, the method 1600 may also include operating on a subset $E_1$ of the measurements corresponding to the subset $S_1$ of the modulation patterns, in order to obtain a coarse image at a resolution corresponding to the superpixels. The action of operating on the subset $E_1$ of measurements may include performing a transform on the subset $E_1$ (e.g., as variously described above), or executing an image reconstruction algorithm on the subset $E_1$ (e.g., the total variation algorithm). The coarse image may be displayed using a display device, and/or, used as an initial guess for image reconstruction, and/or, analyzed to detect or classify event/objects occurring in the external environment (i.e., the environment from which the light stream is received).

The subset $S_1$ of coarse patterns may be complete in the sense that they corresponding to all the rows of a B×B invertible (or orthogonal) matrix, where B is the number of superpixels in the array of superpixels, where each of the coarse patterns is specified by a corresponding one of the rows of the B×B matrix. Alternatively, the subset $S_1$ may be incomplete, i.e., may correspond to some but not all the rows of the B×B matrix, e.g., a random or pseudo-random sampling of the rows.

The above-described transform on the subset $E_1$ of measurements may be represented by a matrix whose structure agrees with the measurement matrix and the permutation. For example, if we denote the measurement matrix by H, and represent the permutation by matrix P, the transform matrix may have the form $(HP)^{-1}$. In the case where the measurement matrix is orthogonal, the transform matrix may have the form $(HP)^T$, where the superscript T denotes matrix transposition.

In some embodiments, the measurement matrix includes a plurality of row blocks, e.g., the row blocks $\mathcal{B}_0, \mathcal{B}_1, \ldots, \mathcal{B}_{F-1}$ as variously described above. In these embodiments, the subset $S_1$ of modulation patterns (i.e., the coarse patterns) may be generated from a basal one of the row blocks. In general, when we say that "modulation patterns are generated from a row block", we mean that the modulation patterns are generated from a complete or partial sampling of the rows of that row block.

In the case where the measurement matrix is a Hadamard matrix of the form $H_F \otimes H_B$ and the light modulating array is two-dimensional, each permuted row block $\mathcal{B}_k P$ of the permuted row blocks $\mathcal{B}_0 P, \mathcal{B}_1 P, \ldots, \mathcal{B}_{F-1} P$ has a corresponding 2D superpixel kernel based on the corresponding row of the matrix $H_F$. The 2D superpixel kernel for the permuted row block $\mathcal{B}_k P$ may be obtained by wrapping the corresponding row of $H_F$ in a row-majorized fashion onto an F×F model superpixel. Each 2D superpixel kernel may be characterized by a horizontal sequency value and a vertical sequency value. (The above-described basal row block may be the row block whose permuted version has a 2D superpixel kernel with zero vertical sequency and zero horizontal sequency.) Furthermore, for any i=0, 1, 2, ..., B−1, and any k=0, 1, 2, ..., F−1, a modulation pattern resulting from the ith row of the permuted row block $\mathcal{B}_k P$ may be interpreted as an array of the form $$[[h_i]]_{R \times C} \otimes [[H_F(k)]]_{\sqrt{F} \times \sqrt{F}},$$

where $[[h_i]]_{R \times C}$ denotes the result of wrapping the ith row of $H_B$ (denoted $h_i$) onto an R×C array (where B=R*C), where $[[H_F(k)]]_{\sqrt{F} \times \sqrt{F}}$ denotes the result of wrapping the kth row of $H_F$ onto a $\sqrt{F} \times \sqrt{F}$ array. In other words, $[[H_F(k)]]_{\sqrt{F} \times \sqrt{F}}$ is the 2D superpixel kernel corresponding to the kth permuted row block $\mathcal{B}_k P$.

In some embodiments, the method 1600 may include operating on a subset $E_2$ of the measurements corresponding to a subset $S_2$ of the modulation patterns, in order to obtain a finer-scale image at a resolution finer than the superpixels. The action of operating on the subset $E_2$ of measurements may include performing a transform on the subset $E_2$ (e.g., as variously described above), or executing an image reconstruction algorithm on the subset $E_2$ (e.g., the total variation algorithm). The subset $S_2$ of modulation patterns may include the subset $S_1$ and additional modulation patterns. The additional modulation patterns are based on one or more additional row blocks, i.e., other than the basal row block. (By saying that the additional modulation patterns are based on one or more additional row blocks, we mean that the additional modulation patterns are obtained using at least a partial sampling of the rows in each of the one or more additional row blocks.) The above-mentioned one or more additional row blocks may include any combination of: (a) a row block whose 2D superpixel kernel has zero vertical sequency and unity horizontal sequency; (b) a row block whose 2D superpixel kernel has unity vertical sequency and zero horizontal sequency; and (c) a row block whose 2D superpixel kernel has unity vertical sequency and unity horizontal sequency.

In some embodiments, the method 1600 may include operating on a subset $E_F$ of the measurements corresponding to a subset $S_F$ of the modulation patterns to obtain a finer-scale image at a resolution finer than the superpixels, where the subset $S_F$ of modulation patterns includes the subset $S_1$ and additional modulation patterns. The additional modulation patterns are based on one or more additional row blocks (in addition to the basal row block), e.g., as described above. In one embodiment, the additional modulation patterns are based on a partial sampling of rows in the one or more additional row blocks.

The action of operating on the subset $E_F$ of measurements may include: performing a transform on the subset of measurements, and/or, performing an image reconstruction algorithm (such as total variation) on the subset of measurements. Where the measurement matrix is orthogonal, the subset $E_F$ of measurements may in some embodiments be transformed using a transform matrix of the form $(HP)^T$, where H represents the measurement matrix, and P represents the permutation. In some embodiments, image reconstruction may be performed using any of the methods described in U.S. patent application Ser. No. 14/137,206, filed on Dec. 20, 2013, invented by Thomas A. Goldstein and Matthew A. Herman, which is hereby incorporated by reference in its entirety as though fully and completely set forth herein.

In some embodiments, the method 1600 may include operating on a subset $E_{NZ}$ of the measurements corresponding to a subset $S_{NZ}$ of the modulation patterns to obtain a finer-scale image at a resolution finer than the superpixels. (The finer-scale image may be displayed using a display device.) The subset $S_{NZ}$ of modulation patterns are based on one or more of the row blocks other than the basal row block. The action of operating on the subset $E_{NZ}$ of measurements may include performing a transform on the subset $E_{NZ}$, and/or, performing an image reconstruction algorithm on the subset $E_{NZ}$. Where the measurement matrix is orthogonal, the subset $E_{NZ}$ of measurements may in some embodiments be transformed using a transform matrix of the form $(HP)^T$, where H represents the measurement matrix, and P represents the permutation.

In some embodiments, the method 1600 may include operating on the subset $E_{NZ}$ of measurements corresponding to the subset $S_{NZ}$ of the modulation patterns in order to detect an object or event, or detection motion, or identify an object or event, or classify an object or event, occurring in the external environment. For example, in order to detect an object having strong horizontal sequency (a picket fence, drapes, the trunks of trees in a forest, etc.), the subset $S_{NZ}$ of modulation patterns may be based on a row block whose 2D sequency kernel has pure horizontal sequency. Thus, the subset $E_{NZ}$ of measurements may encode horizontal sequency information present in the external scene.

In some embodiments, the measurement matrix is of the form $H_F \otimes H_B$, where $H_F$ is a Hadamard matrix of order F, where $H_B$ is a Hadamard matrix of order B, where $\otimes$ denotes the Kronecker product operator. F is equal to two or a multiple of 4. Likewise, B is equal to two or a multiple of 4. In some embodiments, F is a power of two. In one embodiment, $F=4^K$, where K is greater than or equal to one.

In some embodiments, the measurement matrix is of the form $H_F \otimes U_B$, where $H_F$ is a Hadamard matrix of order F, where $U_B$ is a unitary matrix of order B. The unitary matrix $U_B$ may be, e.g., a Hadamard matrix, a discrete Fourier transform matrix, a wavelet matrix, or a noiselet matrix. F is equal to two or a multiple of four. B is an integer greater than one, e.g., a power a two.

In some embodiments, the above-described permutation is a permutation on contiguous bit groups within a column index of the selected row, e.g., as variously described above.

In some embodiments, the action of reordering elements of the selected row is performed in real-time while the light stream is being received by the array of light modulating elements.

In some embodiments, the number of columns in the measurement matrix agrees with the number of light modulating elements in the array of light modulating elements.

In some embodiments, the above-described set of operations used to generate each modulation pattern also includes: prior to said transferring the reordered row, modifying the reordered row by multiplying the reordered row with a vector $v_C$ of 1s and –1s in an element-wise fashion. The 1s and –1s are positioned within the vector $v_C$ in order to define a pseudo-random modulation pattern at the resolution of the superpixels. The vector $v_C$ may correspond to the diagonal of the above-described coarse diagonal matrix $D_{coarse}$.

In the case where the measurement matrix is a Hadamard matrix, the reordered row consists of ones and minus ones. Thus, the above-described multiplication of the reordered row and the vector $v_C$ involves multiplications of the form a*b, where a,b∈{–1,1}. It should be understood the multiplication a*b may efficiently implemented in binary logic using an OR gate if we represent the 1 value with a binary zero, and the –1 value with a binary one. Alternatively, if we represent the 1 value with a binary one, and the –1 value with the binary zero, then the multiplication a*b can be implemented by an XNOR gate. Thus, one need not use a general purpose multiplier circuit to implement a*b.

In some embodiments, the above-described set of operations used to generate each modulation pattern may also include: prior to said transferring the reordered row to the array of light modulating elements, modifying the reordered row by multiplying the reordered row with a vector $v_F$ of 1s and –1s in an element-wise fashion. The 1s and –1s are positioned within the vector $v_F$ in order to define a pseudo-random modulation pattern at a resolution finer than the superpixels. The vector $v_F$ may be identified with the diagonal of the matrix $D_{fine}$ discussed above.

In some embodiments, the set of operations used to generate each modulation pattern also includes: prior to said transferring the reordered row to the array of light modulating elements, applying a second reordering to the reordered row, where the second reordering permutes the values of indices within each superpixel, e.g., as described in the "Extra Twist" section. In one embodiment, this second reordering is combined with the first reordering into a single composite reordering. Thus, one permuation on the column index of the selected row is performed to achieved both reorderings.

As described above, the action 1610 of generating the modulation patterns may be performed by digital circuitry. In some embodiments, the digital circuitry may include one or more of the following: (a) one or more programmable hardware elements; (b) one or more application specific integrated circuits (ASICs); and (c) one or more processors configured to execute program instructions.

As described above, a temporal sequence of modulation patterns are generated based on rows of the measurement matrix. It should be understood that the rows may be selected in a random or pseudo-random fashion or in a deterministic fashion, e.g., as variously described above.

Additional embodiments as disclosed in the following numbered paragraphs.

1. A method comprising:

generating a temporal sequence of modulation patterns for an array of signal modulating elements, wherein the temporal sequence of modulation patterns is based on a predefined measurement matrix, wherein said generating is performed by digital circuitry, wherein each of the modulation patterns is generated by performing a set of operations including: (a) selecting a corresponding row of the measurement matrix; (b) reordering elements of the selected row according to a permutation to obtain a reordered row; and (c) transferring the reordered row to the array of signal modulating elements so that elements of the reordered row are mapped onto the array of signal modulating elements;

wherein the permutation is defined so that a first subset of the modulation patterns are coarse patterns that respect a partition of the array of signal modulating elements into an array of superpixels, wherein each of the superpixels includes a respective group of the signal modulating elements;

modulating a received signal with the temporal sequence of modulation patterns to obtain a modulated signal, wherein said modulating is performed by the array of signal modulating elements; and acquiring measurements of intensity of the modulated signal using a signal sensing device, wherein each of the measurements corresponds to a respective one of the modulation patterns.

2. The method of paragraph 1, further comprising: operating on a first subset of the measurements corresponding to the first subset of the modulation patterns to obtain a coarse image at a resolution corresponding to the superpixels.

3. The method of paragraph 2, further comprising: displaying the coarse image using a display device.

4. The method of paragraph 2, wherein the measurement matrix includes a plurality of row blocks, wherein the first subset of the modulation patterns are generated from a first of the row blocks.

5. The method of paragraph 4, further comprising: operating on a second subset of the measurements corresponding to a second subset of the modulation patterns to obtain a finer-scale image at a resolution finer than the superpixels, wherein the second subset of modulation patterns includes the first subset of modulation patterns and additional modulation patterns, wherein the additional modulation patterns are based on one or more additional ones of the row blocks.

6. The method of paragraph 4, further comprising: operating on a second subset of the measurements corresponding to a second subset of the modulation patterns to obtain a finer-scale image at a resolution finer than the superpixels, wherein the second subset of modulation patterns includes the first subset of modulation patterns and additional modulation patterns, wherein the additional modulation patterns are based on a partial sampling of rows in one or more additional ones of the row blocks.

7. The method of paragraph 4, further comprising: operating on a second subset of the measurements corresponding to a second subset of the modulation patterns to obtain a finer-scale image at a resolution finer than the superpixels, wherein the second subset of modulation patterns are based on one or more of the row blocks other than the first row block.

8. The method of paragraph 4, further comprising: operating on a second subset of the measurements corresponding to a second subset of the modulation patterns to detect an event, or classify an object, or identify an object occurring in an external environment, wherein the second subset of modulation patterns are based on one or more of the row blocks other than the first row block.

9. The method of paragraph 1, wherein the measurement matrix is of the form $H_F \otimes H_B$, wherein $H_F$ is a Hadamard matrix of order F, wherein $H_B$ is a Hadamard matrix of order B, wherein $\otimes$ denotes the Kronecker product operator.

10. The method of paragraph 1, wherein the permutation is a permutation on contiguous bit groups within a column index of the selected row.

11. The method of paragraph 1, wherein a number of columns in the measurement matrix agrees with the number of signal modulating elements in the array of signal modulating elements.

12. The method of paragraph 1, wherein the set of operations used to generated each modulation pattern also includes: prior to said transferring the reordered row, modifying the reordered row by multiplying the reordered row with a vector of 1s and −1s in an element-wise fashion, wherein the 1s and −1s are positioned within the vector in order to define a pseudo-random modulation pattern at the resolution of the superpixels.

13. The method of paragraph 1, wherein the set of operations used to generate each modulation pattern also includes: prior to said transferring the reordered row, modifying the reordered row by multiplying the reordered row with a vector of 1s and −1s in an element-wise fashion, wherein the 1s and −1s are positioned within the vector in order to define a pseudo-random modulation pattern at a resolution finer than the superpixels.

14. The method of paragraph 1, wherein the set of operations used to generate each modulation pattern also includes: prior to said transferring the reordered row, applying a second reordering to the reordered row, wherein the second reordering permutes the values of indices within each superpixel.

15. A method comprising:

generating a temporal sequence of 2D modulation patterns for a 2D array of light modulating elements, wherein the temporal sequence of 2D modulation patterns is based on a predefined measurement matrix, where the predefined measurement matrix has the form $H_F \otimes H_B$, where $H_F$ and $H_B$ are Hadamard matrices of order F and B respectively, wherein said generating is performed by digital circuitry, wherein each of the 2D modulation patterns is generated by performing a set of operations including:

selecting a corresponding row of the measurement matrix;

reordering elements of the selected row according to a permutation to obtain a reordered row, wherein the permutation is defined so that the 2D modulation pattern has the form of a Kronecker product of (a) an R×C wrapped version of a corresponding row of the matrix $H_B$ with (b) a $\sqrt{F} \times \sqrt{F}$ wrapped version of a corresponding row of the matrix $H_F$, wherein B=R*C, wherein R and C are integers greater than one and wherein $\sqrt{F}$ is an integer greater than one;

transferring the reordered row to the 2D array of light modulating elements so that elements of the reordered row are mapped onto the 2D array of light modulating elements;

wherein the permutation is defined so that a first subset of the modulation patterns are coarse patterns that respect a partition of the array of light modulating elements into an array of superpixels, wherein each of the superpixels includes a respective group of the light modulating elements;

modulating a light stream with the temporal sequence of 2D modulation patterns to obtain a modulated light stream, wherein said modulating is performed by the 2D array of light modulating elements; and acquiring measurements of intensity of the modulated light stream using a light sensing device, wherein each of the measurements corresponds to a respective one of the 2D modulation patterns. The 2D modulation patterns may correspond to any desired subset of rows in the measurement matrix.

16. The paragraph of claim 15, further comprising: operating on the measurements to determine an image, or detect an event or object occurring in an external environment, or identify an object occurring in the external environment, or classify an object occurring in the external environment.

Any of the various embodiments described herein may be realized in any of various forms, e.g., as a computer-implemented method, as a computer-readable memory medium, as a computer system. A system may be realized by one or more custom-designed hardware devices such as ASICs, by one or more programmable hardware elements such as FPGAs, by one or more processors executing stored program instructions, or by any combination of the foregoing.

In some embodiments, a non-transitory computer-readable memory medium may be configured so that it stores program instructions and/or data, where the program instructions, if executed by a computer system, cause the computer system to perform a method, e.g., any of the method embodiments described herein, or, any combination of the method embodiments described herein, or, any subset of any of the method embodiments described herein, or, any combination of such subsets.

In some embodiments, a computer system may be configured to include a processor (or a set of processors) and a memory medium, where the memory medium stores program instructions, where the processor is configured to read and execute the program instructions from the memory medium, where the program instructions are executable to implement any of the various method embodiments described herein (or, any combination of the method embodiments described herein, or, any subset of any of the method embodiments described herein, or, any combination of such subsets). The computer system may be realized in any of various forms. For example, the computer system may be a personal computer (in any of its various realizations), a workstation, a computer on a card, an application-specific computer in a box, a server computer, a client computer, a hand-held device, a mobile device, a wearable computer, a sensing device, an image acquisition device, a video acquisition device, a computer embedded in a living organism, etc.

Any of the various embodiments described herein may be combined to form composite embodiments. Furthermore, any of the various features, embodiments and elements described in U.S. Provisional Application No. 61/753,359 may be combined with any of the various embodiments described herein.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A method comprising:
    generating a temporal sequence of modulation patterns for an array of light modulating elements, wherein the temporal sequence of modulation patterns is based on a predefined measurement matrix, wherein said generating is performed by digital circuitry, wherein each of the modulation patterns is generated by performing a set of operations including:
        selecting a corresponding row of the measurement matrix;
        reordering elements of the selected row according to a permutation to obtain a reordered row;
        transferring the reordered row to the array of light modulating elements so that elements of the reordered row are mapped onto the array of light modulating elements;
        wherein the permutation is defined so that a first subset of the modulation patterns are coarse patterns that respect a partition of the array of light modulating elements into an array of superpixels, wherein each of the superpixels includes a respective group of the light modulating elements;
    modulating a light stream with the temporal sequence of modulation patterns to obtain a modulated light stream, wherein said modulating is performed by the array of light modulating elements; and
    acquiring measurements of intensity of the modulated light stream using a light sensing device, wherein each of the measurements corresponds to a respective one of the modulation patterns.

2. The method of claim 1, further comprising:
    operating on a first subset of the measurements corresponding to the first subset of the modulation patterns to obtain a coarse image at a resolution corresponding to the superpixels.

3. The method of claim 2, further comprising:
    displaying the coarse image using a display device.

4. The method of claim 2, wherein the measurement matrix includes a plurality of row blocks, wherein the first subset of the modulation patterns are generated from a first of the row blocks.

5. The method of claim 4, further comprising:
    operating on a second subset of the measurements corresponding to a second subset of the modulation patterns to obtain a finer-scale image at a resolution finer than the superpixels, wherein the second subset of modulation patterns includes the first subset of modulation patterns and additional modulation patterns, wherein the additional modulation patterns are based on one or more additional ones of the row blocks.

6. The method of claim 4, further comprising:
    operating on a second subset of the measurements corresponding to a second subset of the modulation patterns to obtain a finer-scale image at a resolution finer than the superpixels, wherein the second subset of modulation patterns includes the first subset of modulation patterns and additional modulation patterns, wherein the additional modulation patterns are based on a partial sampling of rows in one or more additional ones of the row blocks.

7. The method of claim 4, further comprising:
    operating on a second subset of the measurements corresponding to a second subset of the modulation patterns to obtain a finer-scale image at a resolution finer than the superpixels, wherein the second subset of modulation patterns are based on one or more of the row blocks other than the first row block.

8. The method of claim 4, further comprising:
    operating on a second subset of the measurements corresponding to a second subset of the modulation patterns to detect an event, or classify an object, or identify an object occurring in an external environment, wherein the second subset of modulation patterns are based on one or more of the row blocks other than the first row block.

9. The method of claim 1, wherein the measurement matrix is of the form $H_F \otimes H_B$, wherein $H_F$ is a Hadamard matrix of order F, wherein $H_B$ is a Hadamard matrix of order B, wherein $\otimes$ denotes the Kronecker product operator.

10. The method of claim 1, wherein the permutation is a permutation on contiguous bit groups within a column index of the selected row.

11. The method of claim 1, wherein a number of columns in the measurement matrix agrees with the number of light modulating elements in the array of light modulating elements.

12. The method of claim 1, wherein the set of operations used to generated each modulation pattern also includes:
    prior to said transferring the reordered row, modifying the reordered row by multiplying the reordered row with a vector of 1s and −1s in an element-wise fashion, wherein the 1s and −1s are positioned within the vector in order to define a pseudo-random modulation pattern at the resolution of the superpixels.

13. The method of claim 1, wherein the set of operations used to generate each modulation pattern also includes:
    prior to said transferring the reordered row, modifying the reordered row by multiplying the reordered row with a vector of 1s and −1s in an element-wise fashion, wherein the 1s and −1s are positioned within the vector in order to define a pseudo-random modulation pattern at a resolution finer than the superpixels.

14. The method of claim 1, wherein the set of operations used to generate each modulation pattern also includes:
   prior to said transferring the reordered row, applying a second reordering to the reordered row, wherein the second reordering permutes the values of indices within each superpixel.

15. A system comprising:
   digital circuitry configured to generating a temporal sequence of modulation patterns for an array of light modulating elements, wherein the temporal sequence of modulation patterns is based on a predefined measurement matrix, wherein said generating is performed by digital circuitry, wherein each of the modulation patterns is generated by performing a set of operations including: (a) selecting a corresponding row of the measurement matrix; (b) reordering elements of the selected row according to a permutation to obtain a reordered row; and (c) transferring the reordered row to the array of light modulating elements so that elements of the reordered row are mapped onto the array of light modulating elements, wherein the permutation is defined so that a first subset of the modulation patterns are coarse patterns that respect a partition of the array of light modulating elements into an array of superpixels, wherein each of the superpixels includes a respective group of the light modulating elements;
   an array of light modulating elements configured to modulate a light stream with the temporal sequence of modulation patterns to obtain a modulated light stream, wherein said modulating is performed by the array of light modulating elements; and
   a light sensing device configured to acquire measurements of intensity of the modulated light stream using a light sensing device, wherein each of the measurements corresponds to a respective one of the modulation patterns.

16. The system of claim 15, wherein the digital circuitry is further configured to operate on a first subset of the measurements corresponding to the first subset of the modulation patterns to obtain a coarse image at a resolution corresponding to the superpixels.

17. The system of claim 15, wherein the permutation is a permutation on contiguous bit groups within a column index of the selected row.

18. A method comprising:
   generating a temporal sequence of modulation patterns for an array of signal modulating elements, wherein the temporal sequence of modulation patterns is based on a predefined measurement matrix, wherein said generating is performed by digital circuitry, wherein each of the modulation patterns is generated by performing a set of operations including: (a) selecting a corresponding row of the measurement matrix; (b) reordering elements of the selected row according to a permutation to obtain a reordered row; and (c) transferring the reordered row to the array of signal modulating elements so that elements of the reordered row are mapped onto the array of signal modulating elements, wherein the permutation is defined so that a first subset of the modulation patterns are coarse patterns that respect a partition of the array of signal modulating elements into an array of superpixels, wherein each of the superpixels includes a respective group of the signal modulating elements;
   modulating a received signal with the temporal sequence of modulation patterns to obtain a modulated signal, wherein said modulating is performed by the array of signal modulating elements; and
   acquiring measurements of intensity of the modulated signal using a signal sensing device, wherein each of the measurements corresponds to a respective one of the modulation patterns.

19. The method of claim 18, further comprising: operating on a first subset of the measurements corresponding to the first subset of the modulation patterns to obtain a coarse image at a resolution corresponding to the superpixels.

20. The method of claim 18, wherein the permutation is a permutation on contiguous bit groups within a column index of the selected row.

* * * * *